(12) United States Patent
Arae et al.

(10) Patent No.: US 11,315,961 B2
(45) Date of Patent: Apr. 26, 2022

(54) FIELD-EFFECT TRANSISTOR, METHOD FOR PRODUCING SAME, DISPLAY ELEMENT, DISPLAY DEVICE, AND SYSTEM

(71) Applicants: Sadanori Arae, Kanagawa (JP); Yuichi Ando, Hyogo (JP); Yuki Nakamura, Tokyo (JP); Yukiko Abe, Kanagawa (JP); Shinji Matsumoto, Kanagawa (JP); Yuji Sone, Kanagawa (JP); Naoyuki Ueda, Kanagawa (JP); Ryoichi Saotome, Kanagawa (JP); Minehide Kusayanagi, Kanagawa (JP)

(72) Inventors: Sadanori Arae, Kanagawa (JP); Yuichi Ando, Hyogo (JP); Yuki Nakamura, Tokyo (JP); Yukiko Abe, Kanagawa (JP); Shinji Matsumoto, Kanagawa (JP); Yuji Sone, Kanagawa (JP); Naoyuki Ueda, Kanagawa (JP); Ryoichi Saotome, Kanagawa (JP); Minehide Kusayanagi, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 16/486,224

(22) PCT Filed: Mar. 15, 2018

(86) PCT No.: PCT/JP2018/010350
§ 371 (c)(1),
(2) Date: Aug. 15, 2019

(87) PCT Pub. No.: WO2018/169024
PCT Pub. Date: Sep. 20, 2018

(65) Prior Publication Data
US 2020/0006400 A1 Jan. 2, 2020

(30) Foreign Application Priority Data

Mar. 17, 2017 (JP) .............................. JP2017-053733
Mar. 13, 2018 (JP) .............................. JP2018-045946

(51) Int. Cl.
*H01L 27/12* (2006.01)
*H01L 29/417* (2006.01)

(52) U.S. Cl.
CPC .... *H01L 27/1251* (2013.01); *H01L 29/41733* (2013.01)

(58) Field of Classification Search
None
See application file for complete search history.

(56) References Cited

U.S. PATENT DOCUMENTS

| 4,943,837 A | 7/1990 | Konishi et al. |
| 8,188,472 B2 | 5/2012 | Park et al. |

(Continued)

FOREIGN PATENT DOCUMENTS

| CN | 105870169 | 8/2016 |
| JP | 2011-151370 | 8/2011 |

(Continued)

OTHER PUBLICATIONS

International Search Report dated Jun. 20, 2018 in PCT/JP2018/010350 filed on Mar. 15, 2018.

(Continued)

*Primary Examiner* — Daniel Whalen
(74) *Attorney, Agent, or Firm* — IPUSA, PLLC

(57) ABSTRACT

(Object) To miniaturize a field-effect transistor. (Means of Achieving the Object) A field-effect transistor includes a semiconductor film formed on a base, a gate insulating film formed on a part of the semiconductor film, a gate electrode formed on the gate insulating film, and a source electrode and a drain electrode formed in contact with the semicon- (Continued)

ductor film, wherein a thickness of the source electrode and the drain electrode is smaller than a thickness of the gate insulating film, and the gate insulating film includes a region that is not in contact with the source electrode or the drain electrode.

12 Claims, 20 Drawing Sheets

(56) References Cited

U.S. PATENT DOCUMENTS

| | | | |
|---|---|---|---|
| 9,653,614 B2 | 5/2017 | Yamazaki et al. | |
| 9,698,164 B2 | 7/2017 | Morosawa et al. | |
| 9,761,673 B2 | 9/2017 | Abe et al. | |
| 9,859,437 B2 | 1/2018 | Morosawa et al. | |
| 10,008,181 B2 | 6/2018 | Saotome et al. | |
| 10,020,374 B2 | 7/2018 | Sone et al. | |
| 10,115,828 B2 | 10/2018 | Abe et al. | |
| 10,141,185 B2 | 11/2018 | Ueda et al. | |
| 10,170,635 B2 | 1/2019 | Matsumoto et al. | |
| 10,204,799 B2 | 2/2019 | Kusayanagi et al. | |
| 10,235,930 B2 | 3/2019 | Saotome et al. | |
| 10,236,304 B2 | 3/2019 | Arae et al. | |
| 10,269,293 B2 | 4/2019 | Saotome et al. | |
| 10,312,373 B2 | 6/2019 | Arae et al. | |
| 2005/0275038 A1 | 12/2005 | Shih et al. | |
| 2007/0057334 A1 | 3/2007 | Chidambarrao et al. | |
| 2009/0294768 A1* | 12/2009 | Lujan | H01L 29/42384 257/57 |
| 2012/0056161 A1* | 3/2012 | Avouris | H01L 29/41733 257/24 |
| 2012/0097942 A1* | 4/2012 | Imoto | H01L 21/02554 257/43 |
| 2012/0181506 A1 | 7/2012 | Farmer et al. | |
| 2012/0248451 A1* | 10/2012 | Sone | H01L 29/7869 257/59 |
| 2015/0126023 A1 | 5/2015 | Choi et al. | |
| 2015/0255618 A1* | 9/2015 | Chen | H01L 29/45 257/43 |
| 2017/0018650 A1 | 1/2017 | Saotome et al. | |
| 2017/0271381 A1 | 9/2017 | Sone et al. | |
| 2018/0157429 A1 | 6/2018 | Venkat et al. | |

FOREIGN PATENT DOCUMENTS

| | | |
|---|---|---|
| JP | 2011-171422 | 9/2011 |
| JP | 2011-228622 | 11/2011 |
| JP | 2013-130615 | 7/2013 |
| JP | 2013-175710 | 9/2013 |
| JP | 2015-204425 | 11/2015 |
| TW | 201249748 | 12/2012 |

OTHER PUBLICATIONS

Office Action dated Oct. 5, 2018 in TW Application No. 107109032.
Office Action for KR10-2019-7026909 dated Jan. 29, 2021.
Office Action for KR10-2019-7026909 dated Aug. 23, 2021.

* cited by examiner

[Fig. 1A]
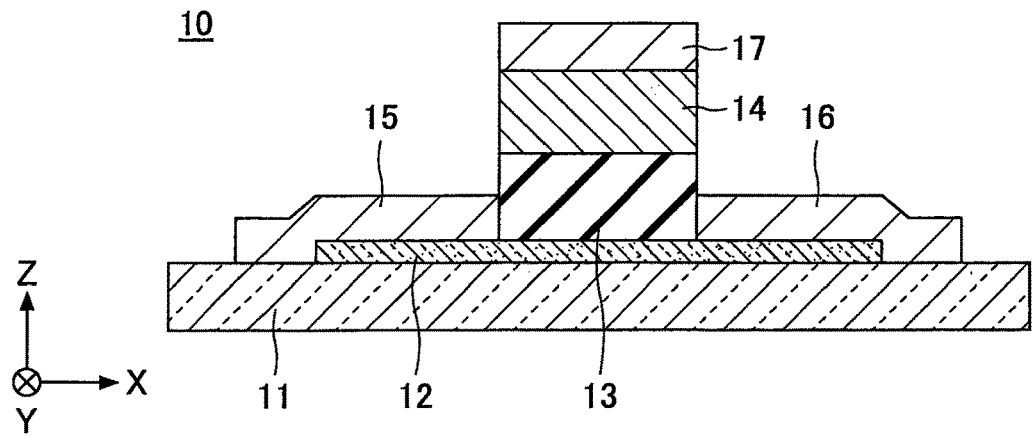
[Fig. 1B]
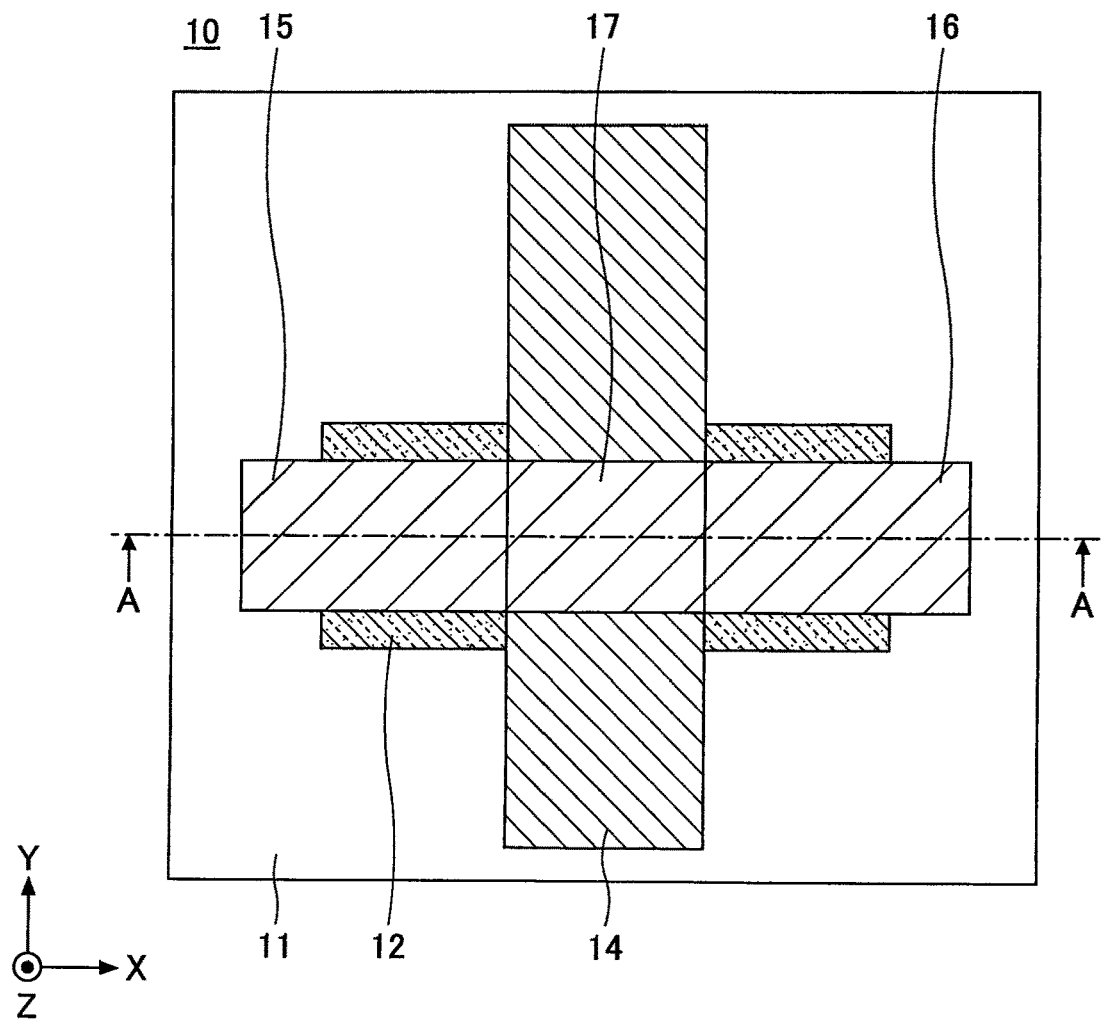

[Fig. 2A]
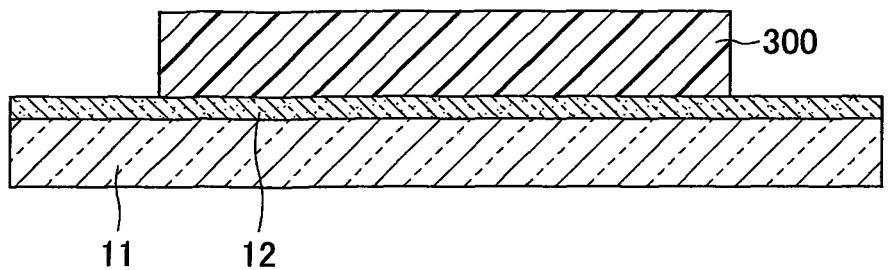
[Fig. 2B]
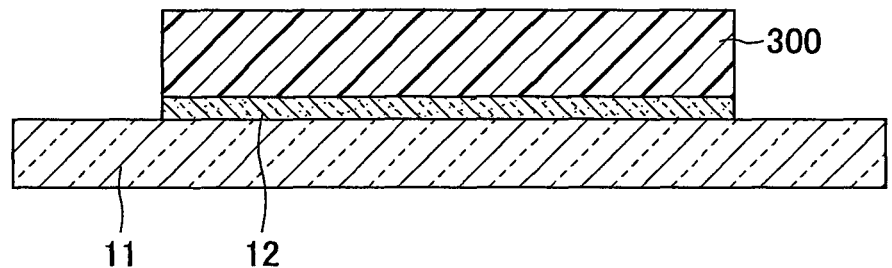
[Fig. 2C]
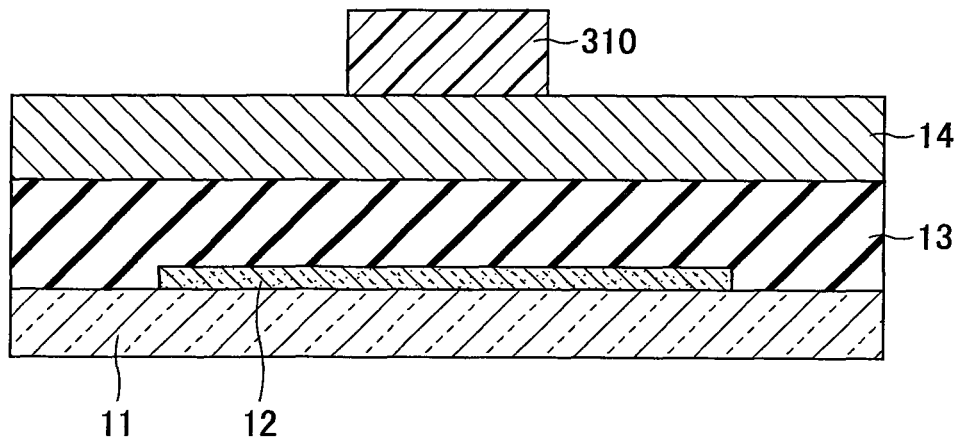

[Fig. 2D]
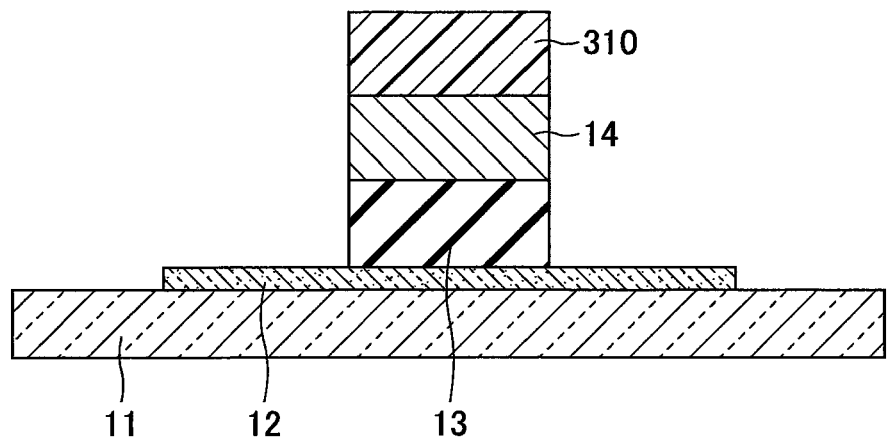
[Fig. 3A]
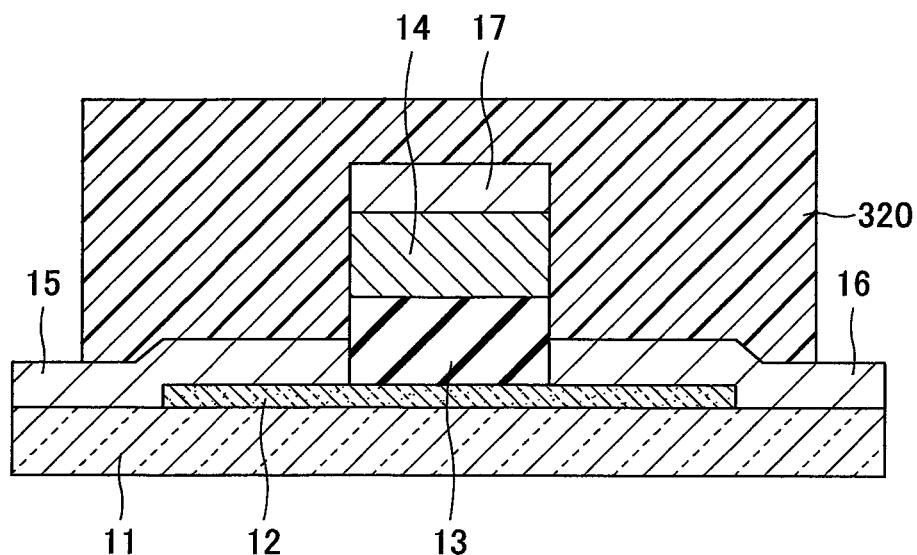

[Fig. 3B]
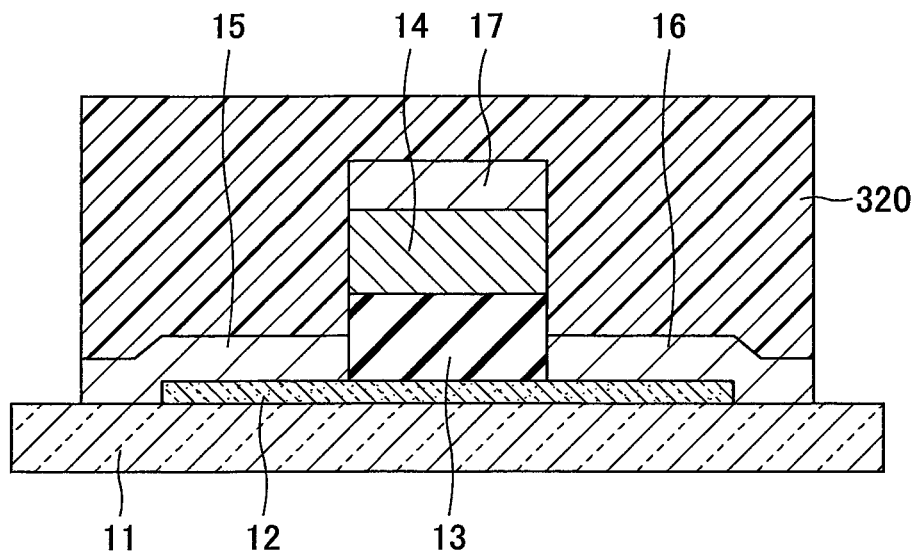
[Fig. 3C]
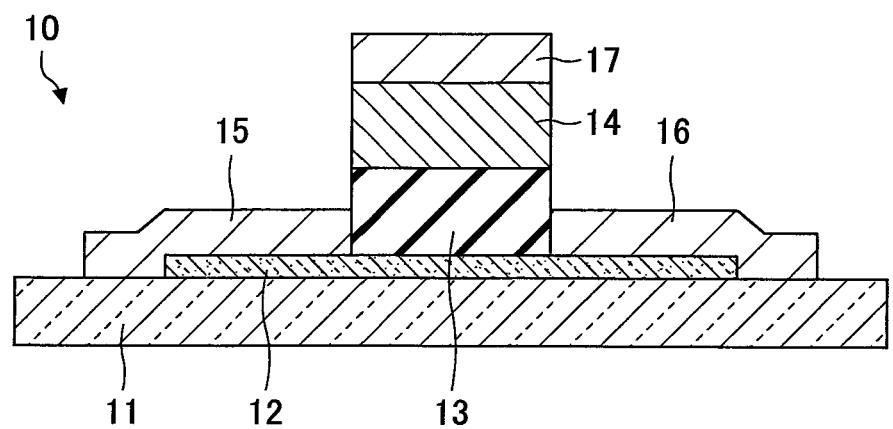

[Fig. 4]
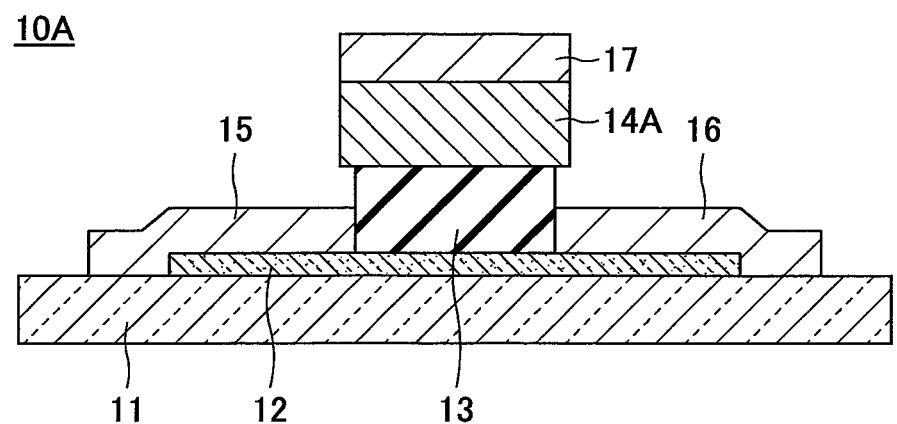
[Fig. 5]
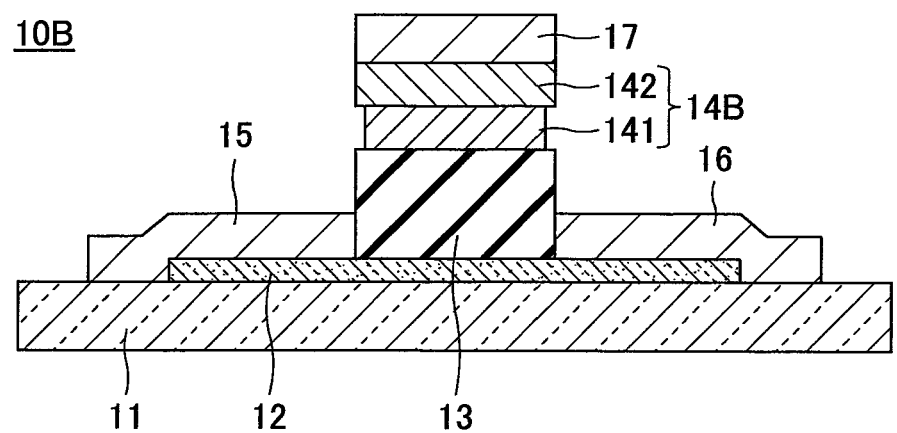

[Fig. 6A]
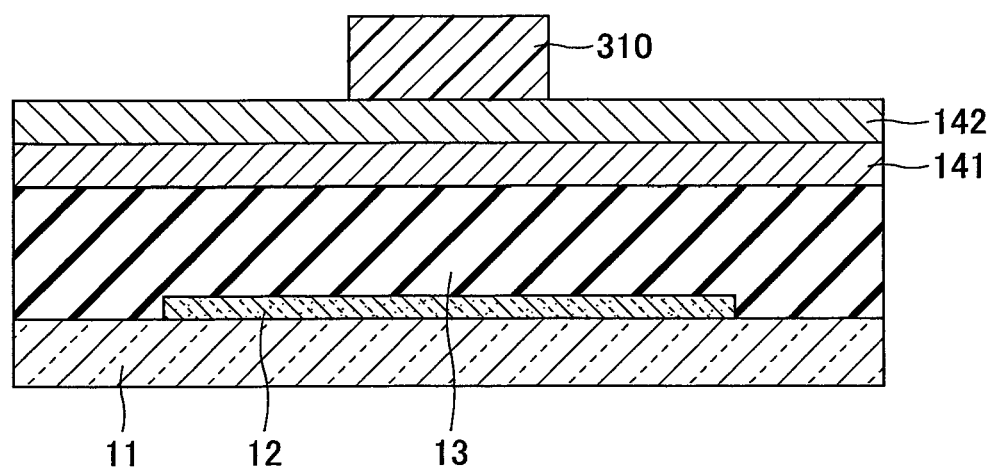
[Fig. 6B]
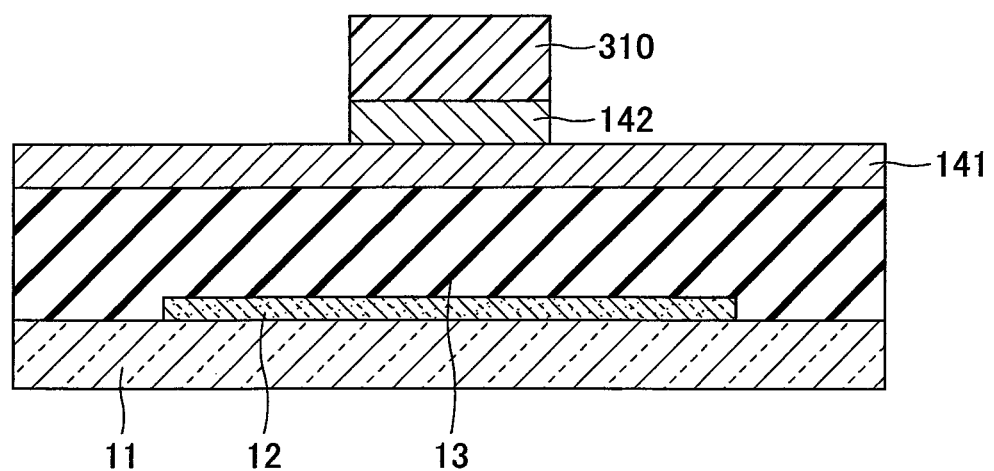

[Fig. 6C]
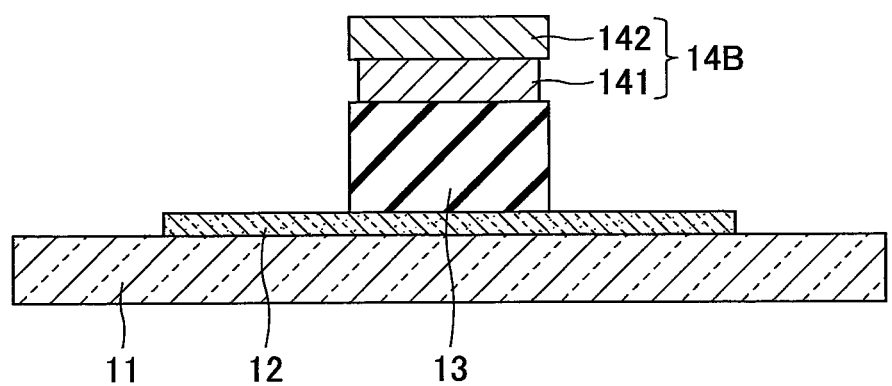
[Fig. 7]
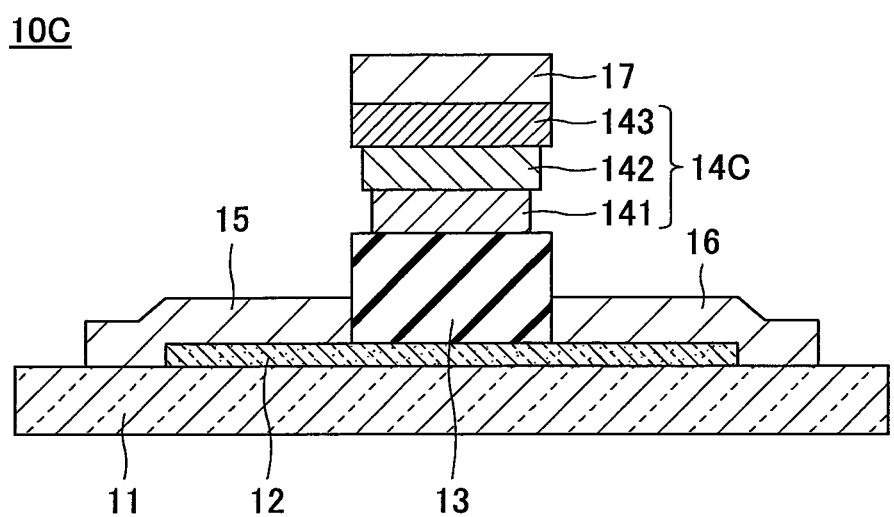

[Fig. 8A]
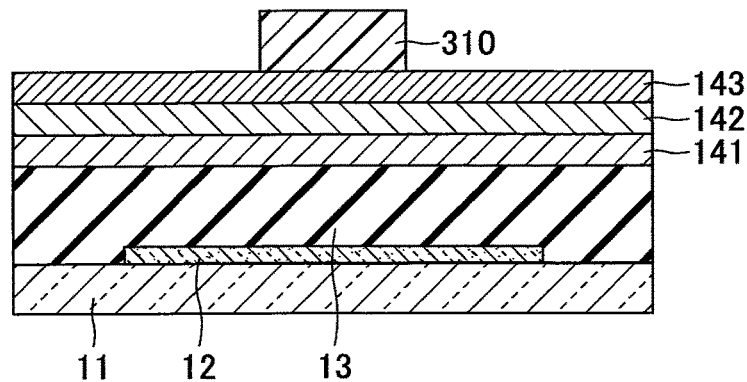
[Fig. 8B]
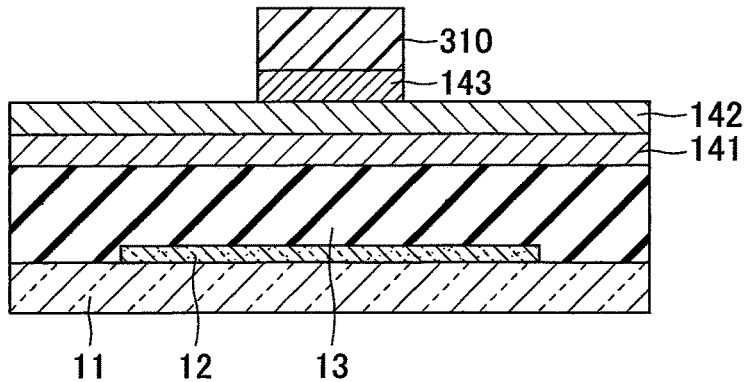
[Fig. 8C]
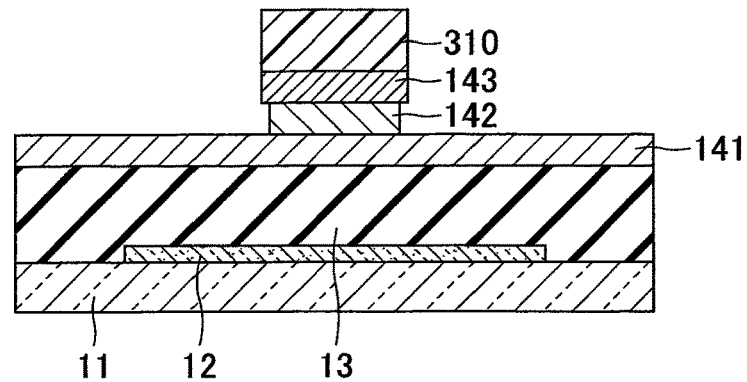

[Fig. 8D]
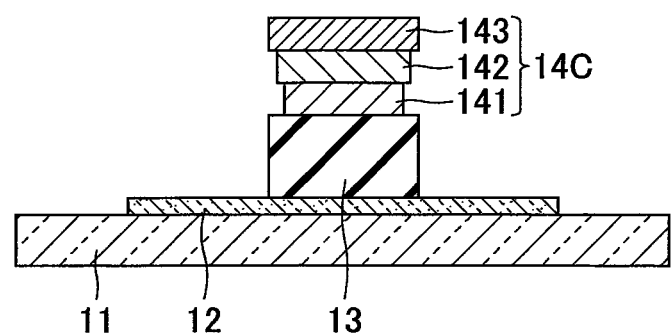
[Fig. 9]
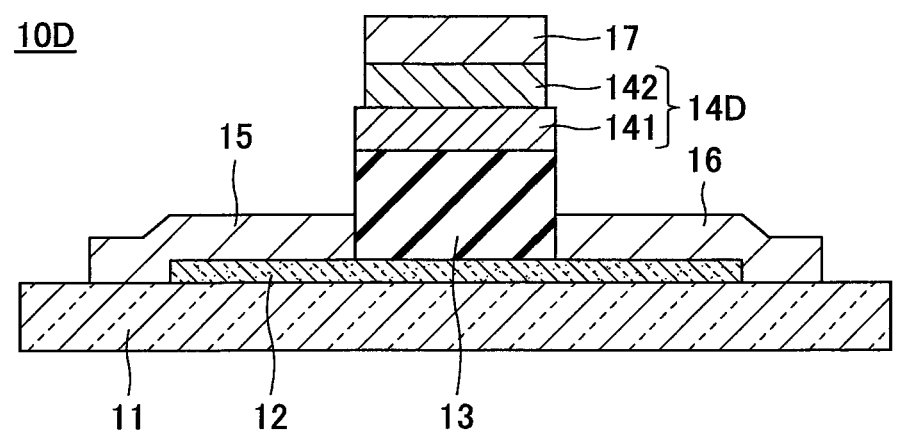

[Fig. 10]
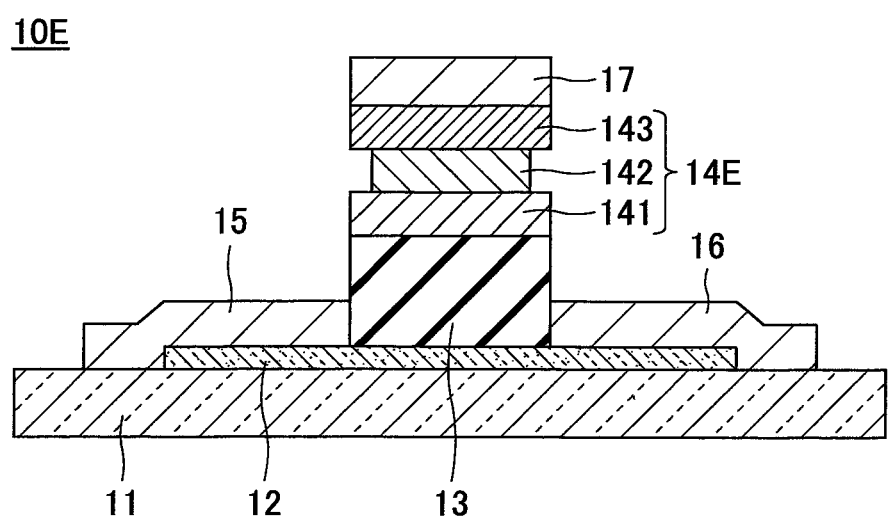

[Fig. 11]
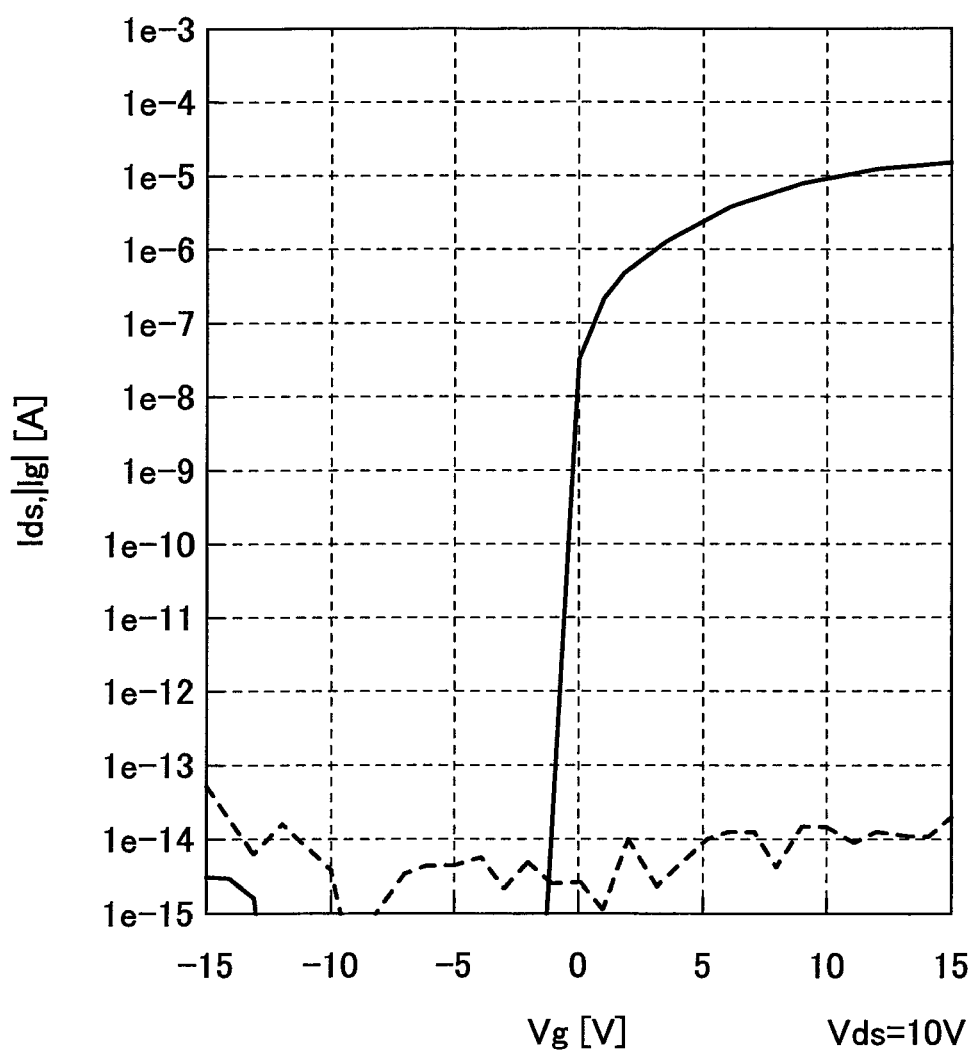

[Fig. 12]
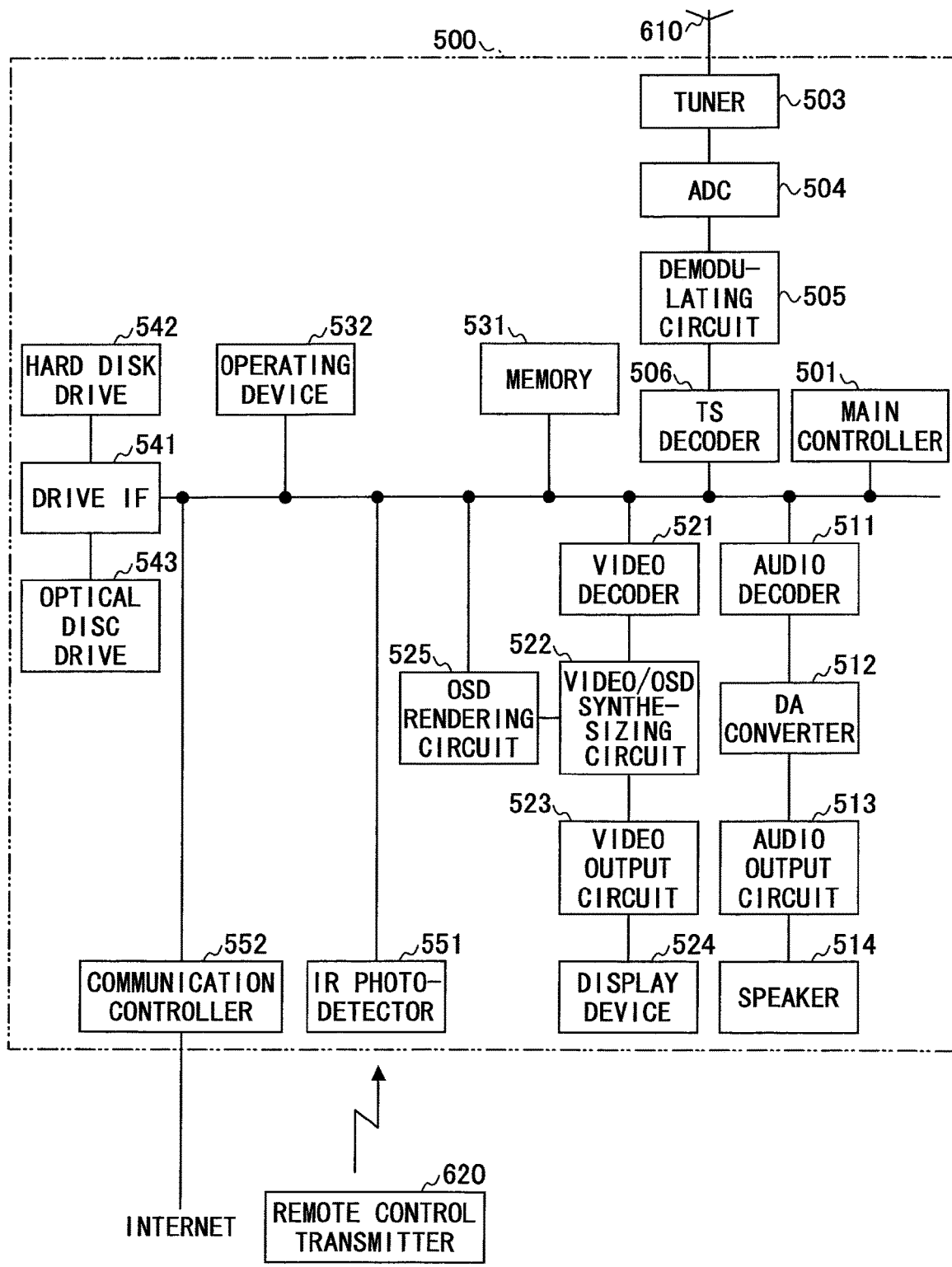

[Fig. 13]
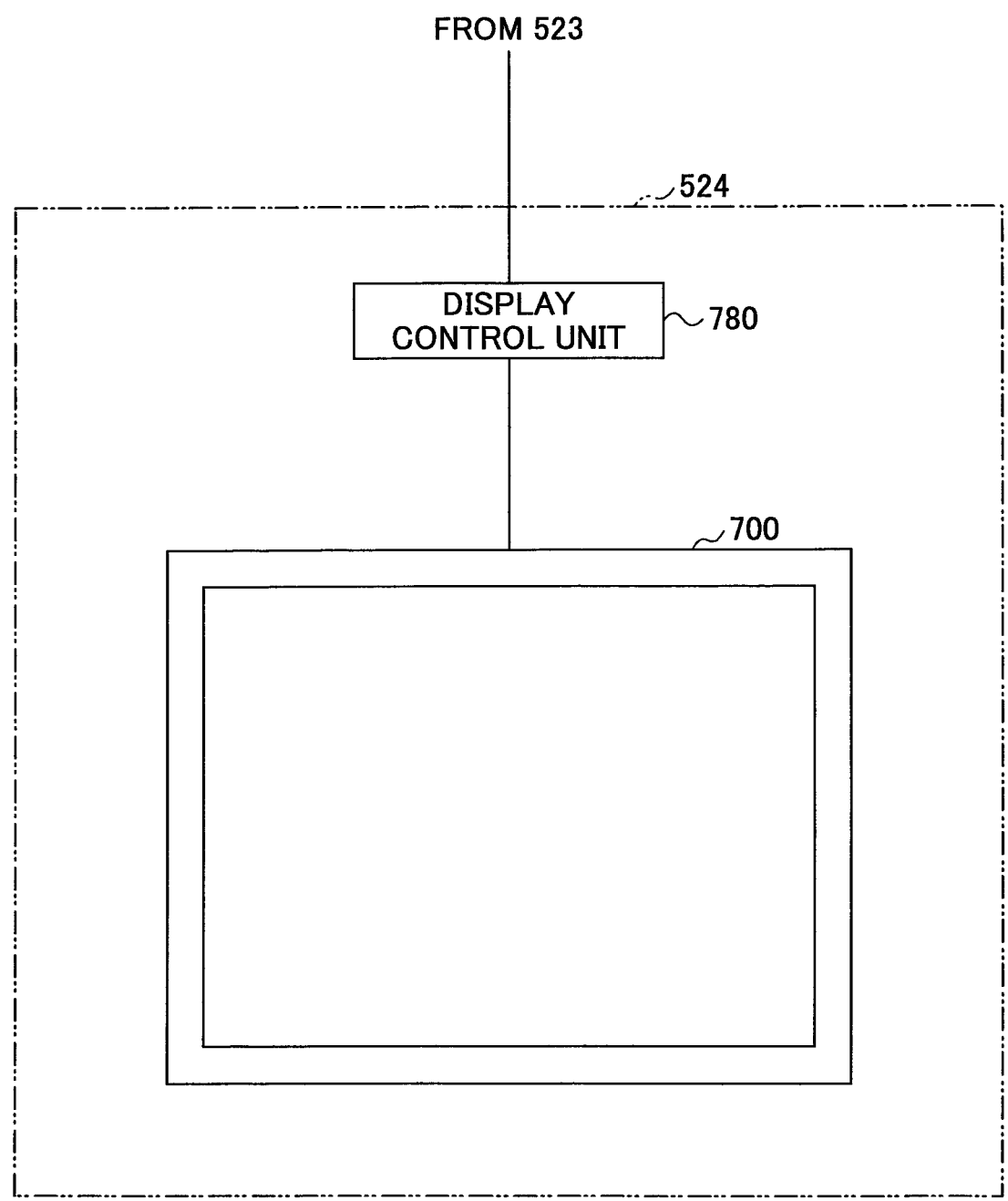

[Fig. 14]
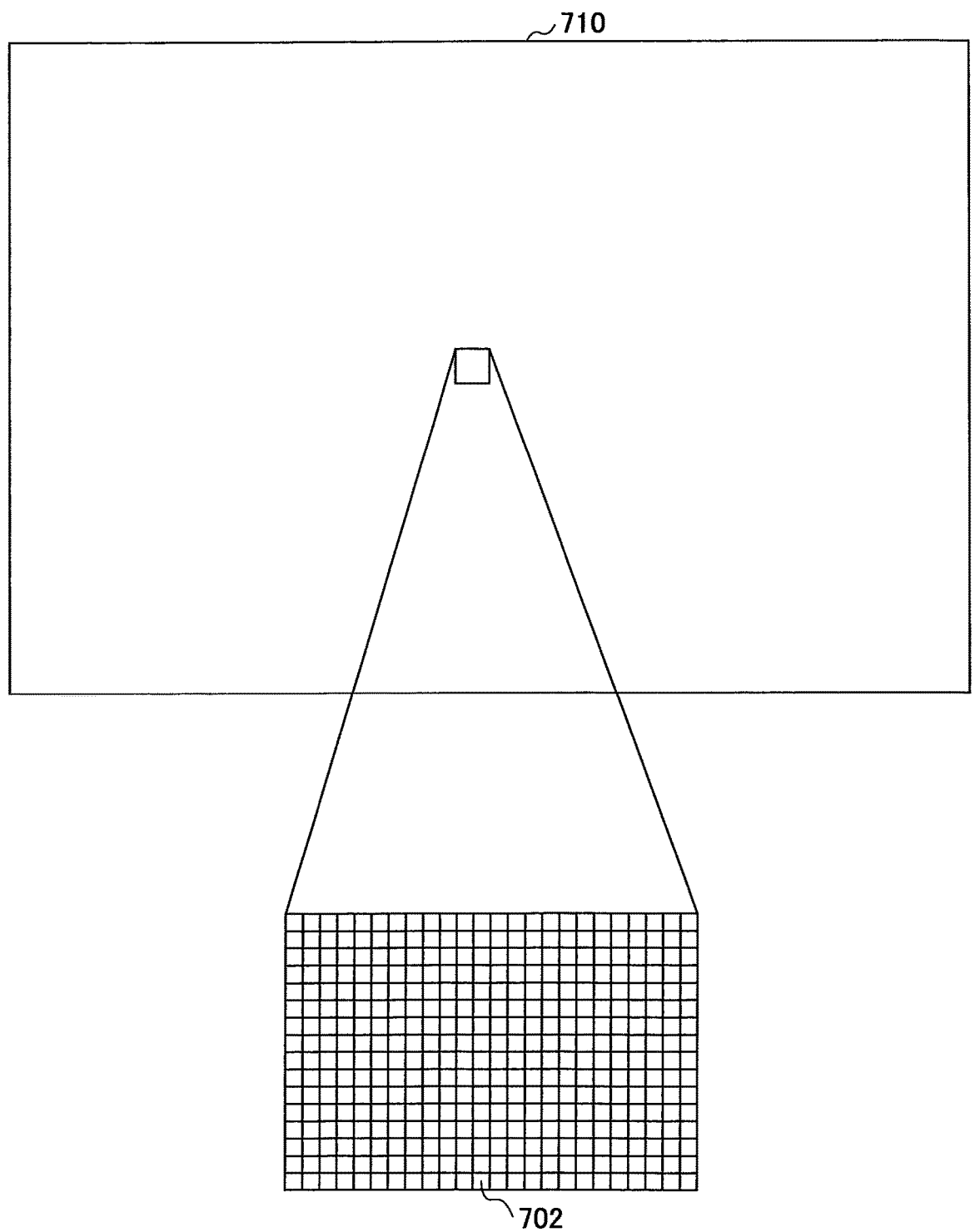

[Fig. 15]
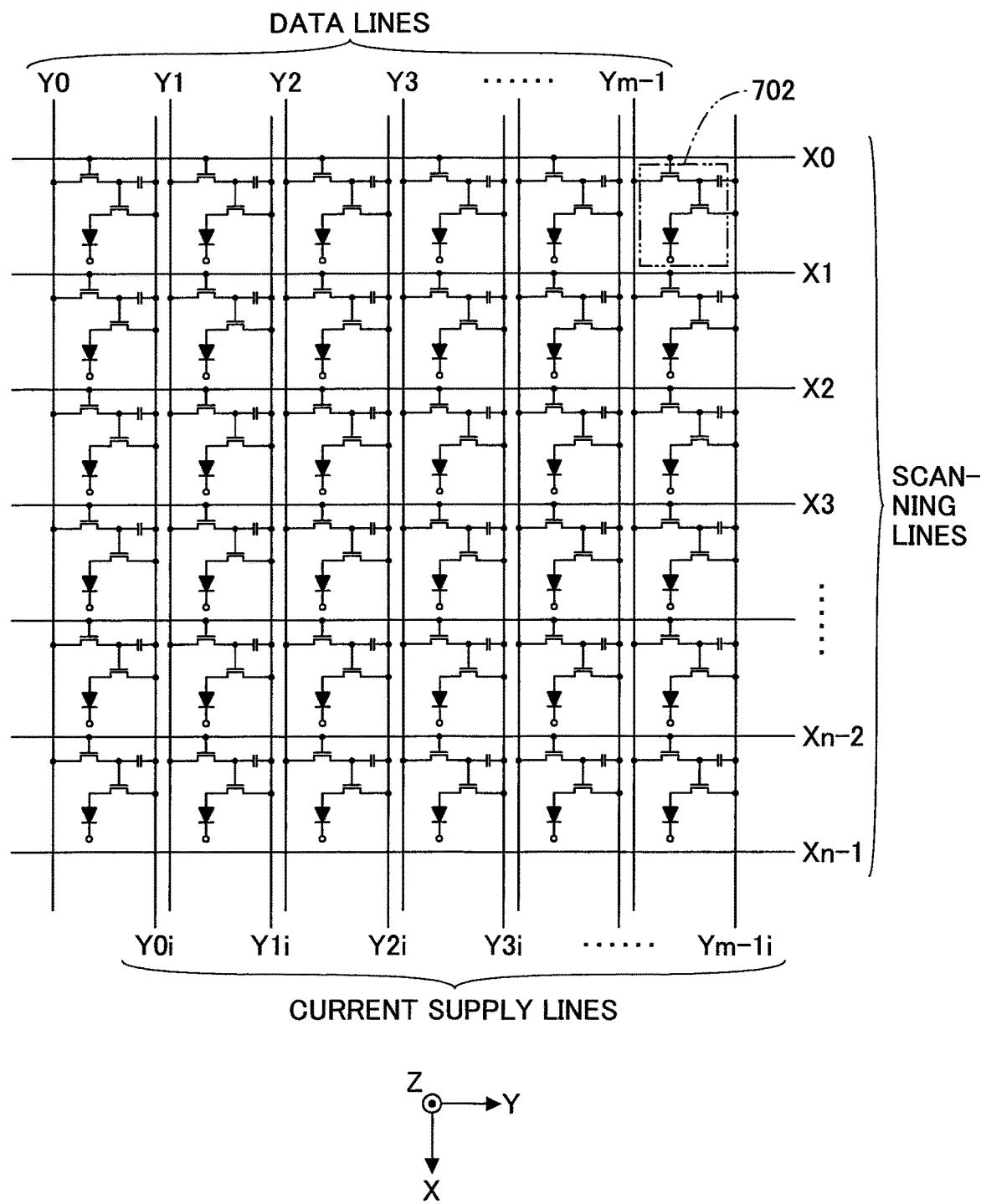

[Fig. 16]
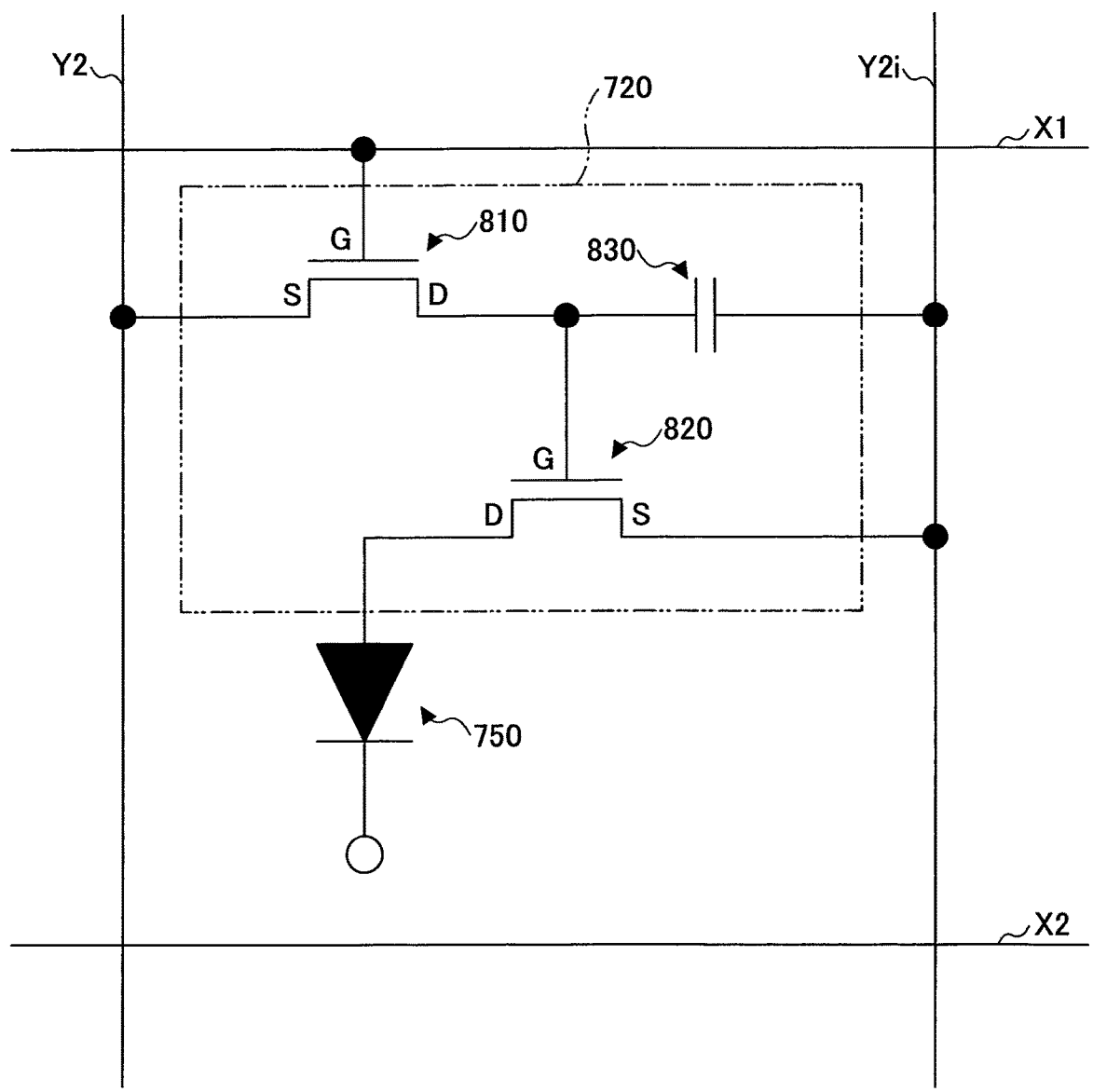

[Fig. 17]
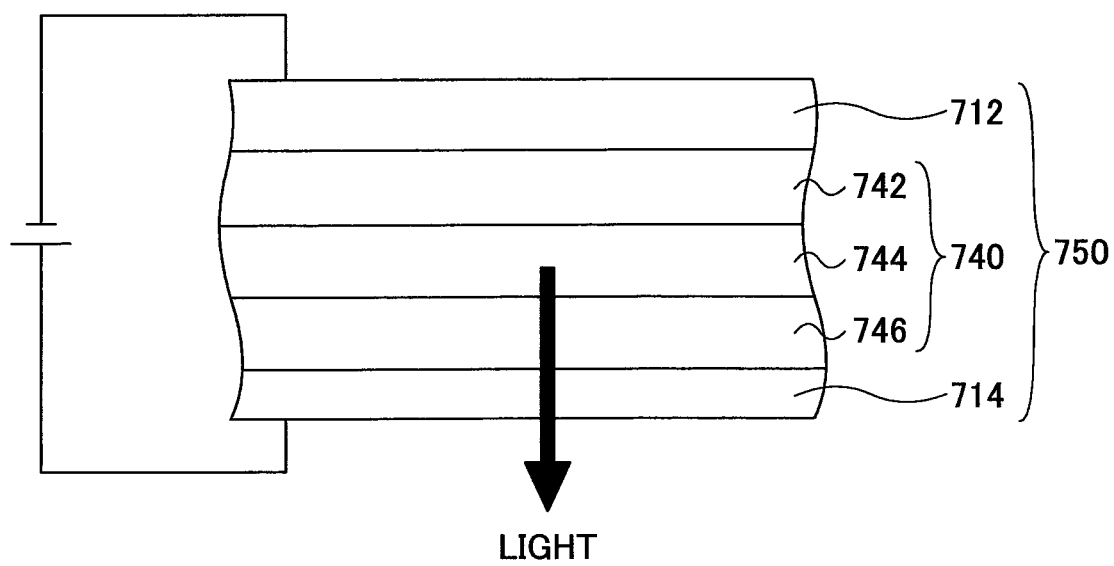

[Fig. 18]
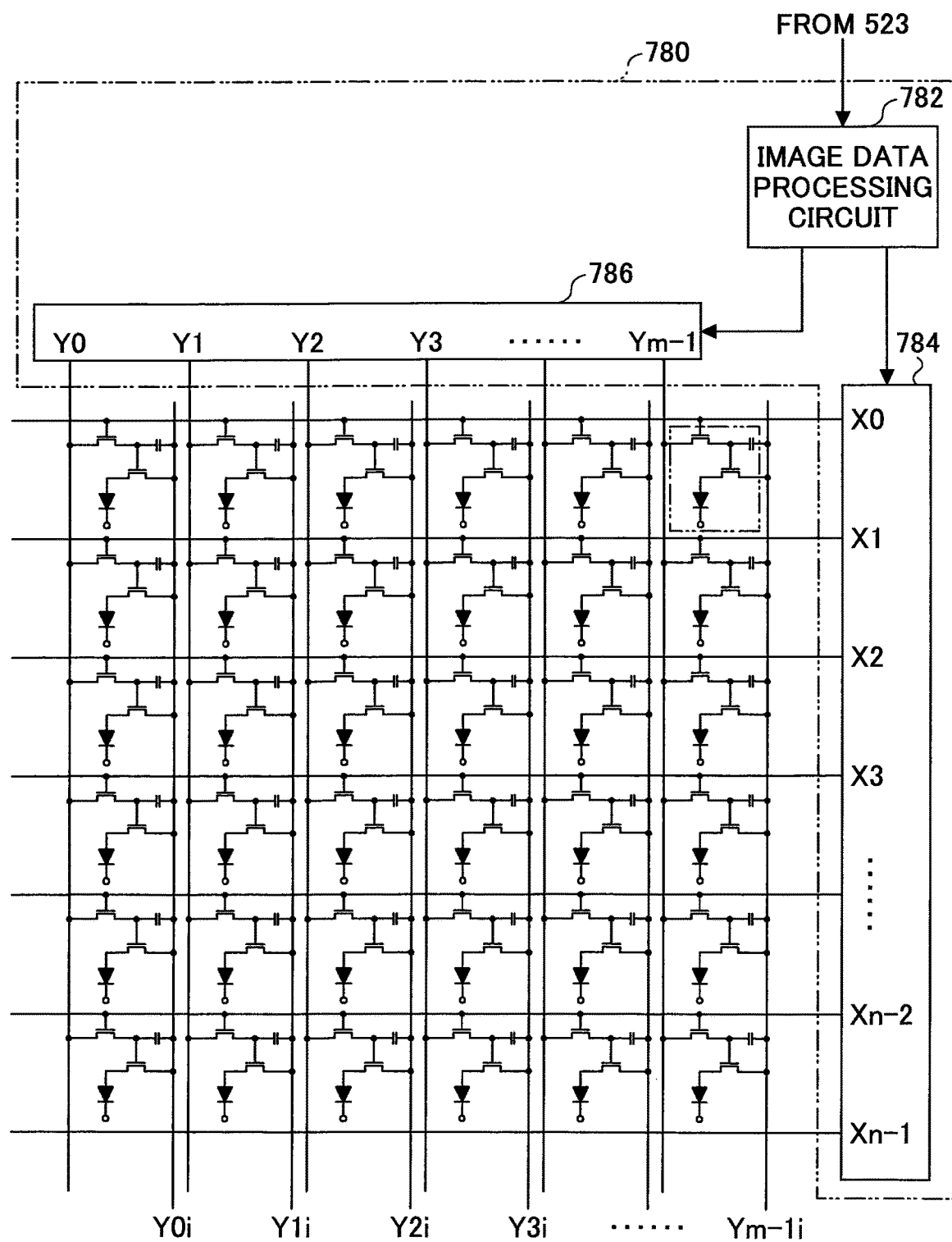

[Fig. 19]
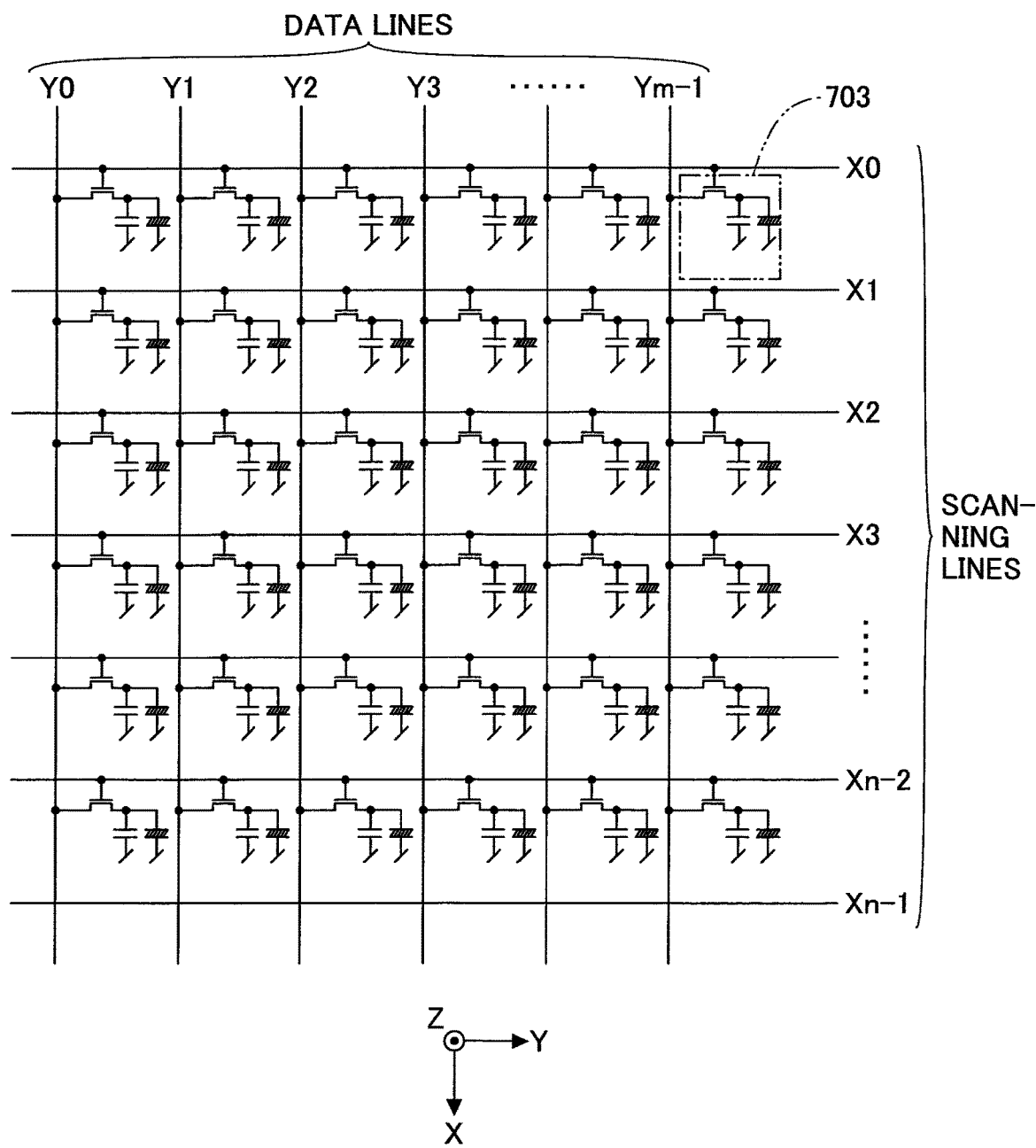

[Fig. 20]
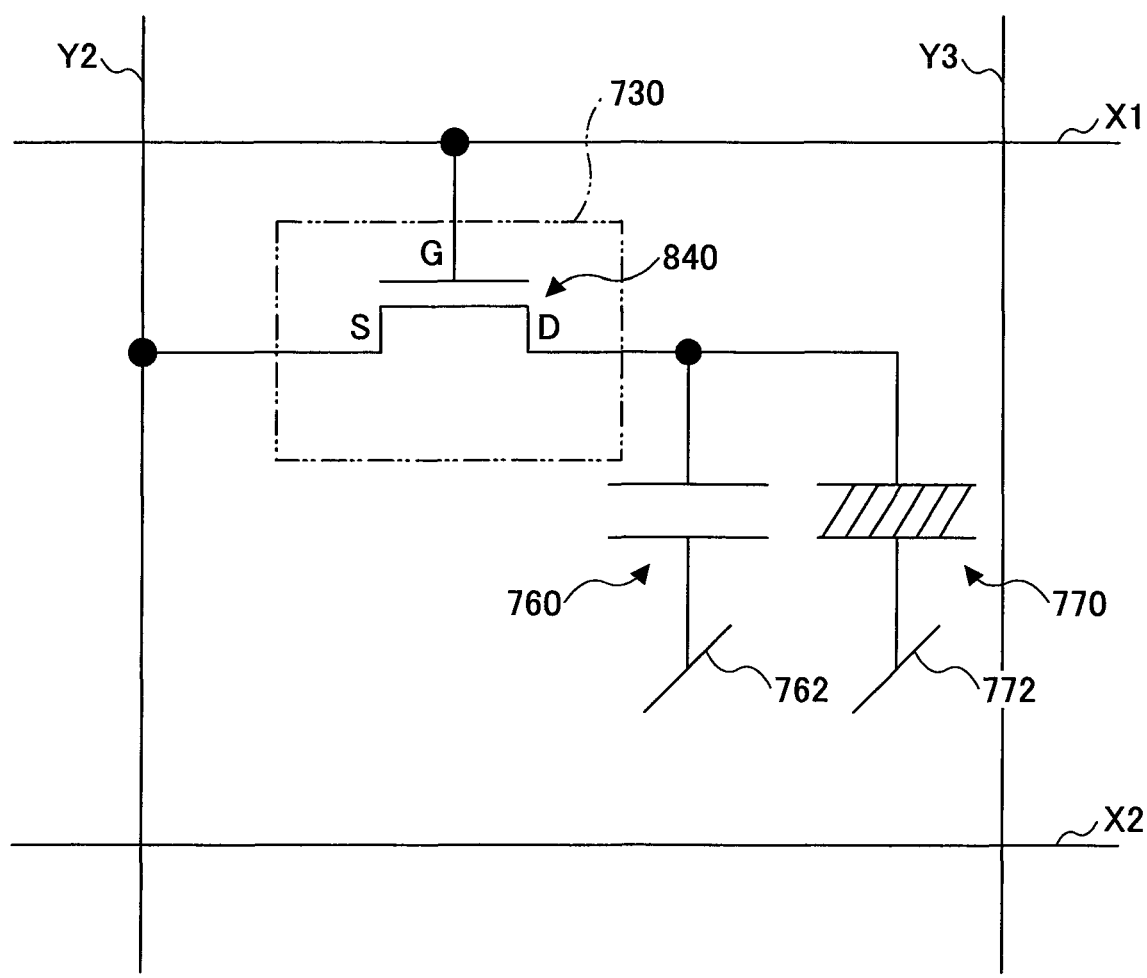

FIELD-EFFECT TRANSISTOR, METHOD FOR PRODUCING SAME, DISPLAY ELEMENT, DISPLAY DEVICE, AND SYSTEM

TECHNICAL FIELD

The disclosures herein generally relate to a field-effect transistor, a method for producing the same, a display element, a display device, and a system.

BACKGROUND ART

Field-effect transistors (FETs) have a low gate current and a flat structure. Therefore, the FETs can be easily produced and can also be easily integrated as compared to bipolar transistors. For these reasons, the field-effect transistors are widely used in integrated circuits used in existing electronic devices.

In such field-effect transistors, silicon, oxide semiconductors, and organic semiconductors are used for semiconductor films. Examples of such field-effect transistors include a field-effect transistor using an oxide semiconductor film with a self-aligned structure. The field-effect transistor has a structure in which a semiconductor film is covered by an interlayer insulating layer, contact holes are formed in the interlayer insulating layer, and a source electrode and a drain electrode formed on the insulating layer are connected to a source region and a drain region through the contact holes. Also, the oxide semiconductor film of the field-effect transistor is provided with a channel forming region and a low resistance region that has lower resistance than that of the channel forming region. Further, an impurity region is formed between the channel forming region and the low resistance region (see Patent Document 1, for example).

CITATION LIST

Patent Literature

[NPL 1] Japanese Unexamined Patent Application Publication No. 2013-175710

SUMMARY OF INVENTION

Technical Problem

However, the structure of the above-described field-effect transistor is required to allow for variations in positions where contact holes, a source electrode, and a drain electrode are formed. Therefore, the structure of the above-described field-effect transistor is not suitable for miniaturization. Further, given that the impurity region is formed between the channel forming region and the low resistance region, the above-described field-effect transistor is not suitable for miniaturization.

In view of the above, it is an object of an embodiment of the present invention to miniaturize a field-effect transistor.

Solution to Problem

A field-effect transistor includes a semiconductor film formed on a base, a gate insulating film formed on a part of the semiconductor film, a gate electrode formed on the gate insulating film, and a source electrode and a drain electrode formed in contact with the semiconductor film, wherein a thickness of the source electrode and the drain electrode is smaller than a thickness of the gate insulating film, and the gate insulating film includes a region that is not in contact with the source electrode or the drain electrode.

Advantageous Effects of Invention

According to at least one embodiment of the present disclosures, a field-effect transistor can be miniaturized.

BRIEF DESCRIPTION OF DRAWINGS

FIG. 1A is a diagram illustrating a field-effect transistor of a first embodiment;

FIG. 1B is a diagram illustrating the field-effect transistor of the first embodiment;

FIG. 2A is a diagram (part 1) illustrating a process for producing the field-effect transistor of the first embodiment;

FIG. 2B is a diagram (part 1) illustrating a process for producing the field-effect transistor of the first embodiment;

FIG. 2C is a diagram (part 1) illustrating a process for producing the field-effect transistor of the first embodiment;

FIG. 2D is a diagram (part 1) illustrating a process for producing the field-effect transistor of the first embodiment;

FIG. 3A is a diagram (part 2) illustrating a process for producing the field-effect transistor of the first embodiment;

FIG. 3B is a diagram (part 2) illustrating a process for producing the field-effect transistor of the first embodiment;

FIG. 3C is a diagram (part 2) illustrating a process for producing the field-effect transistor of the first embodiment;

FIG. 4 is a cross-sectional view illustrating a field-effect transistor of a second embodiment;

FIG. 5 is a cross-sectional view illustrating a field-effect transistor of a third embodiment;

FIG. 6A is a diagram illustrating a process for producing the field-effect transistor of the third embodiment;

FIG. 6B is a diagram illustrating a process for producing the field-effect transistor of the third embodiment;

FIG. 6C is a diagram illustrating a process for producing the field-effect transistor of the third embodiment;

FIG. 7 is a cross-sectional view illustrating a field-effect transistor of a fourth embodiment;

FIG. 8A is a diagram illustrating a process for producing the field-effect transistor of the fourth embodiment;

FIG. 8B is a diagram illustrating a process for producing the field-effect transistor of the fourth embodiment;

FIG. 8C is a diagram illustrating a process for producing the field-effect transistor of the fourth embodiment;

FIG. 8D is a diagram illustrating a process for producing the field-effect transistor of the fourth embodiment;

FIG. 9 is a cross-sectional view illustrating a field-effect transistor of a fifth embodiment;

FIG. 10 is a cross-sectional view illustrating a field-effect transistor of a sixth embodiment;

FIG. 11 is a diagram illustrating characteristics of a field-effect transistor produced in Example 1;

FIG. 12 is a block diagram illustrating a configuration of a television apparatus of a seventh embodiment;

FIG. 13 is an explanatory diagram (part 1) of the television apparatus of the seventh embodiment;

FIG. 14 is an explanatory diagram (part 2) of the television apparatus of the seventh embodiment;

FIG. 15 is an explanatory diagram (part 3) of the television apparatus of the seventh embodiment;

FIG. 16 is an explanatory diagram of a display element of the seventh embodiment;

FIG. 17 is an explanatory diagram of an organic electroluminescent (EL) element of the seventh embodiment;

FIG. 18 is an explanatory diagram (part 4) of the television apparatus of the seventh embodiment;

FIG. 19 is an explanatory diagram (part 1) of another display element of the seventh embodiment; and FIG. 20 is an explanatory diagram (part 2) of the another display element of the seventh embodiment.

DESCRIPTION OF EMBODIMENTS

In the following, embodiments of the present invention will be described with reference to the drawings.

In the drawings, the same elements are indicated by the same reference numerals and a duplicate description thereof may be omitted.

First Embodiment

Configuration of Field-Effect Transistor

FIGS. 1A and 1B are diagrams illustrating a field-effect transistor of a first embodiment. FIG. 1A is a cross-sectional view and FIG. 1B is a plan view. FIG. 1A illustrates a vertical sectional view taken along line A-A of FIG. 1B. For convenience of explanation, some elements illustrated in the plan view of FIG. 1B are indicated by the same hatching as that used in the cross-sectional view of FIG. 1A.

Referring to FIGS. 1A and 1B, a field-effect transistor 10 is a top-gate/top-contact field-effect transistor that includes a base 11, a semiconductor film 12, a gate insulating film 13, a gate electrode 14, a source electrode 15, a drain electrode 16, and a gate electrode covering layer 17. The field-effect transistor 10 may be a topgate/bottom-contact field-effect transistor. The field-effect transistor 10 is a typical example of a semiconductor device.

In the present embodiment, for convenience, the gate electrode covering layer 17 side is represented as an upper side or one side, and the base 11 side is represented as a lower side or the other side. Also, a surface of the respective elements on the gate electrode covering layer 17 side is represented as an upper surface or one surface and a surface of the respective elements on the base 11 side is represented as a lower surface or the other surface. However, the field-effect transistor 10 can be used upside down or can be disposed at any angle. Also, a plan view refers to viewing an object from an upper surface of the base 11 in a normal direction (z-axis direction). A planar shape refers to a shape of an object when viewed from the upper surface of the base 11 in the normal direction (z-axis direction). In addition, a vertical section refers to a cross section of the respective elements on the base 11 taken in a lamination direction. A transverse section refers to a cross section of the respective elements on the base 11 taken in a direction perpendicular to the lamination direction (direction parallel to the upper surface of the base 11).

In the field-effect transistor 10, the semiconductor film 12 is formed in a predetermined region on the insulating base 11. The gate insulating film 13 is formed in a predetermined region on the semiconductor film 12. Also, the gate electrode 14 having the same pattern as that of the gate insulating film 13 is formed on the gate insulating film 13. Further, the source electrode 15 and the drain electrode 16 covering the base 11 and the semiconductor film 12 are formed with the gate insulating film 13 being interposed between the source electrode 15 and the drain electrode 16, such that a channel is formed in the semiconductor film 12. Further, the gate electrode covering layer 17 is formed on the gate electrode 14.

As used herein, the same pattern as that of the gate insulating film refers to a pattern in which the gate electrode substantially overlaps the gate insulating film in a plan view. Also, substantially overlapping includes, of course, a case in which the gate insulating film and the gate electrode have the same shape, and also includes, as will be described below, a case in which an outer edge portion of an lower surface of the gate electrode protrudes a few hundred nm from the periphery of an upper surface of the gate insulating film and a case in which an outer edge portion of the upper surface of the gate insulating film protrudes a few hundred nm from the periphery of the lower surface of the gate electrode, for example. Hereinafter, the respective elements of the field-effect transistor 10 will be described in detail.

The base 11 is an insulating member on which the semiconductor film 12 is formed. A shape, a structure, and a size of the base 11 are not particularly limited and may be appropriately selected depending on the purpose. By way of example, in FIGS. 1A and 1B, the planar shape of the base 11 is formed in an approximately square shape.

A material of the base 11 is not particularly limited and may be appropriately selected depending on the purpose. For example, a glass base, a plastic base, and the like may be used. The glass base is not particularly limited and may be appropriately selected depending on the purpose. Examples of the glass base include non-alkali glass and silica glass.

The plastic base is not particularly limited and may be appropriately selected depending on the purpose. Examples of the plastic base include polycarbonate (PC), polyimide (PI), polyethylene terephthalate (PET), and polyethylene naphthalate (PEN).

The semiconductor film 12 is formed in a predetermined region of the base 11. A shape, a structure, and a size of the semiconductor film 12 are not particularly limited and may be appropriately selected depending on the purpose. By way of example, in FIGS. 1A and 1B, the planar shape of the semiconductor film 12 is formed in a rectangular shape, with the longer side being in the x-axis direction. The semiconductor film 12 located between the source electrode 15 and the drain electrode 16 serves as a channel region. An average thickness of the semiconductor film 12 is not particularly limited and may be appropriately selected depending on the purpose, but is preferably 5 nm to 1 µm and more preferably 10 nm to 0.5 µm.

A material of the semiconductor film 12 is not particularly limited and may be appropriately selected depending on the purpose. Examples of the material include organic semiconductors such as polycrystalline silicon (p-Si), amorphous silicon (a-Si), an oxide semiconductor, and pentacene. Of them, an oxide semiconductor is preferably used in terms of stability of an interface with the gate insulating film 13.

As an oxide semiconductor constituting the semiconductor film 12, an n-type oxide semiconductor can be used. The n-type oxide semiconductor is not particularly limited and may be appropriately selected depending on the purpose. Preferably, the n-type oxide semiconductor includes at least any one of indium (In), Zn, tin (Sn), and Ti, and also includes an alkaline earth element or a rare earth element. Preferably, the n-type oxide semiconductor includes In and also includes an alkaline earth element or a rare earth element.

Examples of the alkaline earth element include beryllium (Be), magnesium (Mg), calcium (Ca), strontium (Sr), barium (Ba), and radium (Ra).

Examples of the rare earth element include scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

An electron carrier density of indium oxide changes by approximately $10^{18}$ cm$^{-3}$ to $10^{20}$ cm$^{-3}$ depending on the amount of oxygen defects. The indium oxide tends to have oxygen defects. Therefore, unintentional oxygen defects may be produced during a post-process after a semiconductor film containing an oxide is formed. The oxide is preferably formed mainly of two metals that are indium and an alkaline earth element or a rare earth element, both of which are easier to bond with oxygen than indium. This makes it possible to easily control a composition while preventing unintentional oxygen defects from being produced. Accordingly, the electron carrier density can also be properly controlled.

Also, the n-type oxide semiconductor constituting the semiconductor film 12 undergoes substitutional doping with at least one dopant selected from a divalent cation, a trivalent cation, a tetravalent cation, a pentavalent cation, a hexavalent cation, a heptavalent cation, and an octavalent cation. Preferably, a valence of the dopant may be greater than a valence of a metal ion (other than the dopant) constituting the n-type oxide semiconductor. Substitutional doping is also referred to as n-type doping.

The gate insulating film 13 is provided between a part of semiconductor film 12 and the gate electrode 14. The gate insulating film 13 includes a region that is not in contact with the source electrode 15 or the drain electrode 16. A shape, a structure, and a size of the gate insulating film 13 are not particularly limited and may be appropriately selected depending on the purpose. By way of example, in FIGS. 1A and 1B, the planar shape of the gate insulating film 13 is formed in a rectangular shape, with the longer side being in the y-axis direction. A part of the gate insulating film 13 extends from an upper surface of the semiconductor film 12 in the y-axis direction and is formed directly on the base 11.

The gate insulating film 13 is a layer for insulating the gate electrode 14, the semiconductor film 12, the source electrode 15, and the drain electrode 16 from one another. An average thickness of the gate insulating film 13 is not particularly limited and may be appropriately selected depending on the purpose, but is preferably 50 nm to 1000 nm and more preferably 100 nm to 500 nm.

For example, the gate insulating film 13 is an oxide film. The oxide film contains a Group A element that is an alkaline earth metal and a Group B element that is at least one of gallium (Ga), scandium (Sc), yttrium (Y), and a lanthanoid. The oxide film preferably contains a Group C element that is at least one of Zr (zirconium) and Hf (hafnium), and further contains other components as necessary. The oxide film may include one alkaline earth metal element or may include two or more alkaline earth metal elements.

Examples of a lanthanoid include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

The oxide film contains a paraelectric amorphous oxide or is preferably formed of a paraelectric amorphous oxide. A paraelectric amorphous oxide is stable in the atmosphere and can stably form an amorphous structure in a wide range of compositions. A crystal may be included in a part of the oxide film.

Alkaline earth oxides tend to react with moisture or carbon dioxide in the atmosphere and are easily converted into hydroxides or carbonates. Therefore, such alkaline earth oxides alone are not suitable for use in electronic devices. Further, simple oxides such as of lanthanoids excluding Ga, Sc, Y, and Ce tend to be crystallized and cause a leakage current. However, oxides containing an alkaline earth metal and a lanthanoid excluding Ga, Sc, Y, and Ce are stable in the atmosphere and can form an amorphous film in a wide range of compositions. Among lanthanoid elements, Ce specifically becomes tetravalent, and forms a crystal having a perovskite structure together with the alkaline earth metal. Therefore, in order to obtain an amorphous phase, a lanthanoid excluding Ce is desired.

Crystalline phases such as a spinel structure exist for oxides containing an alkaline earth metal and Ga. However, these crystals are not precipitated unless the temperature is significantly high (generally, at 1,000° C. or more), as compared to crystals having a perovskite structure. Also, no report has been presented regarding a stable crystalline phase for oxides containing an alkaline earth metal and a lanthanoid excluding Sc, Y, and Ce. Crystals are rarely precipitated from the amorphous phase even after the post-process at a high temperature. In addition, an amorphous phase becomes more stable when the oxides containing the alkaline earth metal and a lanthanoid excluding Ga, Sc, Y, and Ce are formed of three of more metal elements.

The content of each element included in the oxide film is not specifically limited. However, the oxide film preferably includes metal elements selected from respective element groups so as to form a composition that can maintain a stable amorphous state.

In order to make a film having a high dielectric constant, composition ratios of elements such as Ba, Sr, Lu, and La are preferably increased.

Because the oxide film of the present embodiment can form an amorphous film in a wide range of compositions, the physical properties can also be widely controlled. For example, a dielectric constant of the oxide film of the present embodiment is generally approximately 6 to 20 and is sufficiently high as compared to that of $SiO_2$. However, by selecting a composition, the dielectric constant can be adjusted to an appropriate value according to purpose of use.

Further, a coefficient of thermal expansion for the oxide film of the present embodiment is equivalent to a coefficient of thermal expansion for a general wiring material or a semiconductor material, which is $10^{-6}$ to $10^{-5}$. Therefore, as compared to $SiO_2$ having a coefficient of thermal expansion of $10^{-7}$, the oxide film of the present embodiment rarely has problems such as a peeling of a film even after a heating process is repeatedly performed. In particular, with oxide semiconductors such as aIGZO, a favorable interface is formed.

Therefore, a high-performance semiconductor device can be provided by using the oxide film of the present embodiment.

However, the gate insulating film 13 is not limited to the oxide film that contains at least a Group A element and a Group B element and preferably contains a Group C element. For example, the gate insulating film 13 may be an oxide film that contains Si and an alkaline earth metal. Further, the gate insulating film 13 may be a film formed of $SiO_2$, SiN, SiON, or $Al_2O_3$, for example.

The gate electrode 14 is formed on the gate insulating film 13. The gate electrode 14 is an electrode that applies a gate voltage. The gate electrode 14 is disposed facing the semiconductor film 12 with the gate insulating film 13 being interposed therebetween.

A shape, a structure, and a size of the gate electrode 14 are not particularly limited and may be appropriately selected depending on the purpose. By way of example, in FIGS. 1A and 1B, the planar shape of the gate insulating film 13 is formed in a rectangular shape, with the longer side being in the y-axis direction. The gate electrode 14 substantially overlaps the gate insulating film 13 in a plan view.

A material of the gate electrode 14 is not particularly limited and may be appropriately selected depending on the purpose. Examples of the material include metals such as aluminum (Al), platinum (Pt), palladium (Pd), gold (Au), silver (Ag), copper (Cu), zinc (Zn), nickel (Ni), chromium (Cr), tantalum (Ta), molybdenum (Mo), and titanium (Ti), alloys thereof, and mixtures of these metals.

Further, examples of the material of the gate electrode 14 include conductive oxides such as indium oxide, zinc oxide, tin oxide, gallium oxide, and niobium oxide, complex compounds thereof, and mixtures thereof. Also, organic conductors such as polyethylene dioxythiophene (PEDOT) and polyaniline (PANI) may be used. An average thickness of the gate electrode 14 is not particularly limited and may be appropriately selected depending on the purpose, but is preferably 10 nm to 1 μm and more preferably 50 nm to 300 nm.

The source electrode 15 and the drain electrode 16 are formed on the base 11 and are in contact with the semiconductor film 12. The source electrode 15 and the drain electrode 16 are formed to cover a part of the semiconductor film 12, and are formed spaced apart a predetermined distance from each other, which serves as a channel region. The source electrode 15 and the drain electrode 16 are electrodes that cause an electric current to flow when a gate voltage is applied to the gate electrode 14.

Shapes, structures, and sizes of the source electrode 15 and the drain electrode 16 are not particularly limited and may be appropriately selected depending on the purpose. By way of example, in FIGS. 1A and 1B, the planar shapes of the source electrode 15 and the drain electrode 16 are formed in rectangular shapes, with the longer sides being in the x-axis direction.

Materials of the source electrode 15 and the drain electrode 16 are not particularly limited and may be appropriately selected depending on the purpose. Examples of the material include metals such as aluminum, gold, platinum, palladium, silver, copper, zinc, nickel, chromium, tantalum, molybdenum and titanium, alloys thereof, and mixtures of these metals. In addition, conductive oxides such as indium oxide, zinc oxide, tin oxide, gallium oxide, and niobium oxide, complex compounds thereof, and mixtures thereof may be used. The source electrode 15 and the drain electrode 16 may use a laminated structure of these materials.

An average thickness of the source electrode 15 and the drain electrode 16 is not particularly limited and may be appropriately selected depending on the purpose. However, the average thickness of the source electrode 15 and of the drain electrode 16 are formed smaller than the average thickness of the gate insulating film 13.

This prevents the source electrode 15 and the drain electrode 16 from coming in contact with the gate electrode 14. As a result, it is possible to suppress a leakage current between the source electrode 15 and the gate electrode 14 and also suppress a leakage current between the drain electrode 16 and the gate electrode 14. Accordingly, favorable transistor characteristics can be obtained.

The gate electrode covering layer 17 is formed in a predetermined region on the gate electrode 14. The gate electrode covering layer 17 is formed in contact with the gate electrode 14 without making contact with other elements constituting the field-effect transistor 10 including the source electrode 15 and the drain electrode 16.

The gate electrode covering layer 17 is a layer formed of the same material as that of the source electrode 15 and the drain electrode 16, and has nearly the same thickness as that of the source electrode 15 and the drain electrode 16. A combined planar shape of the source electrode 15, the drain electrode 16, and the gate electrode covering layer 17 are formed in a rectangular shape, with the longer side being in the x-axis direction. However, the source electrode 15, the drain electrode 16, and the gate electrode covering layer 17 are spaced apart from one another and are not electrically connected to one another.

<Method for Producing Field-Effect Transistor>

Next, a method for producing the field-effect transistor illustrated in FIGS. 1A and 1B will be described. FIGS. 2A through 2D and FIG. 3A through 3C are diagrams illustrating a process for producing the field-effect transistor of the first embodiment.

First, in a step illustrated in FIG. 2A, the base 11, which is a glass base, for example, is prepared. The semiconductor film 12 is formed on the entire surface of the base 11. The material and the thickness of the base 11 can be appropriately selected as described above. Also, in order to clean the surface of the base 11 and improve adhesiveness, pretreatments such as oxygen plasma, UV ozone, and UV radiation cleaning are preferably performed.

A method for forming the semiconductor film 12 is not particularly limited and may be appropriately selected depending on the purpose. Examples of the method for forming the film include a vacuum process such as a sputtering method, a pulse laser deposition (PLD) method, a chemical vapor deposition (CVD) method, and an atomic layer deposition (ALD) method, and also include a solution process such as a dip coating method, a spin coating method, and a die coating method. The material and the thickness of the semiconductor film 12 can be appropriately selected as described above.

After the semiconductor film 12 is formed, a resist made of a photosensitive resin is formed on the entire surface of the semiconductor film 12 and is subjected to an exposure and development process (photolithography process). As a result, a resist layer 300 (an etching mask) covering a predetermined region on the semiconductor film 12 is formed.

Next, in a step illustrated in FIG. 2B, using the resist layer 300 as the etching mask, a region of the semiconductor film 12 that is not covered by the resist layer 300 is removed by etching. For example, the semiconductor film 12 can be removed by wet etching.

Next, in a step illustrated in FIG. 2C, after the resist layer 300 is removed, the gate insulating film 13 and the gate electrode 14, which cover the semiconductor film 12, are sequentially laminated over the entire surface of the base 11.

A method for forming the gate insulating film 13 is not particularly limited and may be appropriately selected depending on the purpose. Examples of the method for forming the film include a vacuum process such as a sputtering method, a pulse laser deposition (PLD) method, a chemical vapor deposition (CVD) method, and an atomic layer deposition (ALD) method, and also include a solution process such as a dip coating method, a spin coating method, and a die coating method. The material and the thickness of the gate insulating film 13 can be appropriately selected as described above.

A method for forming the gate electrode 14 is not particularly limited and may be appropriately selected depending on the purpose. Examples include a vacuum process such as a sputtering method, a pulse laser deposition (PLD) method, a chemical vapor deposition (CVD) method, and an atomic layer deposition (ALD) method, and also include a solution process such as a dip coating method, a spin coating method, and a die coating method. The material and the thickness of the gate electrode 14 can be appropriately selected as described above.

After the gate insulating film 13 and the gate electrode 14 are formed, a resist made of a photosensitive resin is formed on the entire surface of the gate electrode 14 and is subjected to the exposure and development process (photolithography process). As a result, a resist layer 310 (an etching mask) covering a predetermined region on the gate electrode 14 is formed.

Next, in a step illustrated in FIG. 2D, using the resist layer 310 as the etching mask, a region of the gate electrode 14 that is not covered by the resist layer 310 is removed by etching. Subsequently, a region of the gate insulating film 13 that is not covered by the resist layer 310 is removed by etching.

For example, when the gate electrode 14 is formed of Al, Mo, or an alloy containing one of Al and Mo, the gate electrode 14 can be etched by using a PAN (phosphoric-acetic-nitric-acid) based etching solution. The PAN-based etching solution is a mixed solution of phosphoric acid, nitric acid, and acetic acid.

Also, when the gate insulating film 13 is an oxide film containing at least the above-described Group A element and the Group B element, the gate insulating film 13 can be etched by using an etching solution containing at least any one of hydrochloric acid, oxalic acid, nitric acid, phosphoric acid, acetic acid, sulfuric acid, and hydrogen peroxide.

Further, when the gate insulating film 13 is an oxide film containing Si, the gate insulating film 13 can be etched by using an etching solution containing at least any one of hydrofluoric acid, ammonium fluoride, hydrogen fluoride ammonium, and organic alkali.

Moreover, the resist layer 310 has an etching resistance to PAN-based etching solutions.

Accordingly, the gate electrode 14 and the gate insulating film 13 can be etched by performing a single mask production process (namely, a process for forming the resist layer 310) only. For example, etching can be performed by using the same mask (resist layer 310). Namely, unlike conventional techniques, separate masks are not required to be produced for etching of the gate electrode 14 and for etching of the gate insulating film 13.

Next, in a step illustrated in FIG. 3A, after the resist layer 310 is removed, the source electrode 15 and the drain electrode 16 covering the base 11 and the semiconductor film 12 are formed with the gate insulating film 13 being interposed between the source electrode 15 and the drain electrode 16, such that a channel is formed in the semiconductor film 12. At the same time, the gate electrode covering layer 17 is formed on the gate electrode 14.

A method for forming the source electrode 15, the drain electrode 16, and the gate electrode covering layer 17 is not particularly limited and may be appropriately selected depending on the purpose. Examples of the method include a method for forming a film by using a sputtering method, a vacuum deposition method, a dip coating method, a spin coating method, and a die coating method, and subsequently patterning the film by photolithography. The material and the thickness of the source electrode 15, the drain electrode 16, and the gate electrode covering layer 17 can be appropriately selected as described above.

After the source electrode 15, the drain electrode 16, and the gate electrode covering layer 17 are formed, a resist made of a photosensitive resin is formed on the entire surface of the source electrode 15, the drain electrode 16, and the gate electrode covering layer 17, and is subjected to the exposure and development process (photolithography process). As a result, a resist layer 320 (an etching mask) covering predetermined regions on the source electrode 15, the drain electrode 16, and the gate electrode covering layer 17 is formed.

Next, in a step illustrated in FIG. 3B, using the resist layer 320 as the etching mask, regions of the source electrode 15 and the drain electrode 16 that are not covered by the resist layer 320 are removed by etching. For example, the regions of the source electrode 15 and the drain electrode 16 can be removed by wet etching. The gate electrode covering layer 17 is completely covered by the resist layer 320. Thus, the gate electrode covering layer 17 is not etched.

Next, in a step illustrated in FIG. 3C, the resist layer 320 is removed. Accordingly, the self-aligned top-gate field-effect transistor 10 is produced.

The field-effect transistor 10 of the first embodiment is formed such that the source electrode 15 and the drain electrode 16 are in contact with the semiconductor film 12. Unlike conventional techniques, the field-effect transistor 10 of the first embodiment does not require a structure in which a source electrode and a drain electrode formed on an interlayer insulating layer are connected to a source region and a drain region of a semiconductor film 12 through contact holes. In addition, an impurity region or the like is not required to be formed. Accordingly, the field-effect transistor 10 can be miniaturized.

Further, the field-effect transistor 10 is a self-aligned (self-alignment structure) field-effect transistor in which the source electrode 15 and the drain electrode 16 are produced in a self-alignment manner by using the gate insulating film 13 as a mask. This allows a channel length to be controlled based on the width of the gate insulating film 13, making it possible to miniaturize the field-effect transistor 10.

Moreover, in the field-effect transistor 10, the planar shape of the gate insulating film 13 is substantially the same as the planar shape of the gate electrode 14. Therefore, parasitic capacitance can be reduced. As a result, switching characteristics of the field-effect transistor 10 can be enhanced.

Furthermore, the thickness of the source electrode 15 and of the drain electrode 16 are smaller than the thickness of the gate insulating film 13. This prevents the source electrode 15 and the drain electrode 16 from making contact with the gate electrode 14. Also, because the source electrode 15 and the drain electrode 16 are thin, a difference in level is formed between the source electrode 15 and the gate electrode covering layer 17 and also between the drain electrode 16 and the gate electrode covering layer 17. This ensures that the source electrode 15 and the drain electrode 16 are separated from the gate electrode covering layer 17. Accordingly, it is possible to suppress a leakage current between the source electrode 15 and the gate electrode 14 and also a leakage current between the drain electrode 16 and the gate electrode 14. Therefore, favorable transistor characteristics can be obtained.

In addition, in the field-effect transistor 10, the gate electrode 14 and the gate insulating film 13 are etched by using the same mask. This allows the number of etching masks used in the process for producing the field-effect transistor 10 to be reduced as compared to conventional production processes, making it possible to simplify the process for producing the field-effect transistor 10.

Second Embodiment

A second embodiment illustrates an example in which a gate electrode is formed in an overhang shape. In the second embodiment, a description of the same elements as those of the above-described embodiment may be omitted.

FIG. 4 is a cross-sectional view illustrating a field-effect transistor of the second embodiment. A difference between a field-effect transistor 10A illustrated in FIG. 4 and the field-effect transistor 10 (see FIG. 1A) is that the gate electrode 14 is replaced with a gate electrode 14A.

The gate electrode 14A is formed in an overhang shape. Namely, a gate insulating film 13 includes a region whose width is narrower than the gate electrode 14A.

In the example of FIG. 4, the sides of the gate electrode 14A are perpendicular to the upper surface of a base 11. The outer edge portion of the lower surface of the gate electrode 14A protrudes from the periphery of the upper surface of the gate insulating film 13. Namely, in the entire region of the gate electrode 14A, the width of the gate electrode 14A is wider than the width of the gate insulating film 13. An overhang amount (a difference in width between the gate electrode 14A and the gate insulating film 13 illustrated in the cross section of FIG. 4) can be set to approximately 100 nm to a few hundred nm, for example.

However, the sides of the gate electrode 14A are not required to be perpendicular to the upper surface of the base 11. The gate electrode 14A may be formed in a downward tapered shape that becomes narrower toward the gate insulating film 13 or may be formed in an upward tapered shape that becomes wider toward the gate insulating film 13. Namely, as long as the gate insulating film 13 has a region whose width is narrower than the width of the gate electrode 14A, the gate insulating film 13 may be formed in any shape.

The gate electrode 14A in the overhang shape can be produced by controlling a wet etching process in the step illustrated in FIG. 2D. Namely, by controlling the wet etching process, the gate insulating film 13 having the region whose width is narrower than the width of the gate electrode 14A can be produced.

In this way, the field-effect transistor 10A of the second embodiment has a similar structure to that of the field-effect transistor 10 of the first embodiment. Therefore, the field-effect transistor 10A can be miniaturized.

Further, in the field-effect transistor 10A, the gate electrode 14A is formed in an overhang shape and the gate insulating film 13 has a region whose width is narrower than the width of the gate electrode 14A. This ensures that the source electrode 15 and the drain electrode 16 are separated from the gate electrode covering layer 17. Also, the thickness of the source electrode 15 and of the drain electrode 16 are smaller than the thickness of the gate insulating film 13. Because of this synergistic effect, it is possible to suppress a leakage current between the source electrode 15 and the gate electrode 14A and also a leakage current between the drain electrode 16 and the gate electrode 14A. Therefore, favorable transistor characteristics can be obtained.

Third Embodiment

A third embodiment illustrates an example in which a gate electrode has an undercut. In the third embodiment, a description of the same elements as those of the above-described embodiments may be omitted.

<Structure of Field-Effect Transistor>

FIG. 5 is a cross-sectional view illustrating a field-effect transistor of the third embodiment. A difference between a field-effect transistor 10B illustrated in FIG. 5 and the field-effect transistor 10 (see FIG. 1A) is that the gate electrode 14 is replaced with a gate electrode 14B.

The gate electrode 14B has an undercut. Namely, the gate electrode 14B includes a region whose width is narrower than the width of a gate insulating film 13.

In the example of FIG. 5, the gate electrode 14B is a multi-layer film in which a conductive film 142 is laminated on a conductive film 141. In the multi-layer film constituting the gate electrode 14B, widths of the layers become narrower layer by layer toward the gate insulating film 13. To be more specific, the width of the conductive film 141 is narrower than the width of the conductive film 142. Therefore, the outer edge portion of the lower surface of the conductive film 142 protrudes from the periphery of the upper surface of the conductive film 141. Also, the width of the conductive film 141 is narrower than the width of the gate insulating film 13. Therefore, the outer edge portion of the upper surface of the gate insulating film 13 protrudes from the periphery of the lower surface of the conductive film 141.

An undercut amount (a difference in width between the conductive film 141 and the conductive film 142 as illustrated in the cross section of FIG. 5) can be set to approximately 100 nm to a few hundred nm, for example.

A material of the conductive film 141 is not particularly limited and may be appropriately selected depending on the purpose. For example, it is possible to use metals, alloys, mixtures of a plurality of metals, and conductive films other than metal films, which can be etched by using an organic alkaline solution as an etching solution. Examples of the material include aluminum (Al), Al alloys (alloys mainly containing Al), and oxide films having conductivity.

Examples of the organic alkaline solution include strong alkaline solutions such as tetramethyl ammonium hydroxide (TMAH-based), 2-hydroxyethyl trimethylammonium hydroxide (CHOLINE-based), and monoethanolamine solutions.

A material of the conductive film 142 is not particularly limited and may be appropriately selected depending on the purpose. For example, it is possible to use metals, alloys, mixtures of a plurality of metals, and conductive films other than metal films, which have an etching resistance to an organic alkaline solution and also have a higher etching rate for a predetermined etching solution than the conductive film 141. Examples of the material include metals such as molybdenum (Mo), tungsten (W), titanium (Ti), tantalum (Ta), chromium (Cr), copper (Cu), and nickel (Ni), alloys thereof, mixtures of these metals, and oxide films having conductivity.

An average thickness of the conductive film 141 is not particularly limited and may be appropriately selected depending on the purpose, but is preferably 10 nm to 200 nm and more preferably 50 nm to 100 nm. An average thickness of the conductive film 142 is not particularly limited and may be appropriately selected depending on the purpose, but is preferably 10 nm to 200 nm and more preferably 50 nm to 100 nm.

<Method for Producing Field-Effect Transistor>

In order to produce the field-effect transistor 10B, steps similar to those described in FIG. 2A and FIG. 2B are performed first. Next, in a step illustrated in FIG. 6A, after a resist layer 300 is removed, a gate insulating film 13 covering a semiconductor film 12 is formed over the entire surface of a base 11. Further, the conductive film 141 and the conductive film 142 are sequentially laminated on the gate insulating film 13. A method for forming the gate insulating film 13 is as described above.

A method for forming the conductive films 141 and 142 is not particularly limited and may be appropriately selected depending on the purpose. Examples of the method include a vacuum process such as a sputtering method, a pulse laser deposition (PLD) method, a chemical vapor deposition (CVD) method, and an atomic layer deposition (ALD) method, and also include a solution process such as a dip coating method, a spin coating method, and a die coating method. Other examples include a printing process such as an inkjet printing, a nanoimprinting, and a gravure printing.

As an example herein, a material (an Al alloy, for example) that can be etched by using an organic alkaline solution as an etching solution is selected as a material of the conductive film 141. A material (a Mo alloy, for example) that has a higher etching rate for a predetermined etching solution than the conductive film 141 is selected as a material of the conductive film 142.

After the conductive film 142 is formed, a resist made of a photosensitive resin is formed on the entire surface of the conductive film 142 and is subjected to the exposure and development process (photolithography process). As a result, a resist layer 310 (etching mask) covering a predetermined region on the conductive film 142 is formed.

Next, in a step illustrated in FIG. 6B, using the resist layer 310 as the etching mask, a region of the conductive film 142 that is not covered by the resist layer 310 is removed by etching. By performing etching using an etching solution whose etching rate is higher for the conductive film 142 than for the conductive film 141, only the region of the conductive film 142 that is not covered by the resist layer 310 can be removed by etching. At this time, the conductive film 141 is hardly etched. The ratio of the etching rate of the conductive film 141 to the etching rate of the conductive film 142 is preferably at least 1:10. Further, the resist layer 310 has an etching resistance to the etching solution used in this step.

Next, in a step illustrated in FIG. 6C, a region of the conductive film 141 that is not covered by the conductive film 142 is removed by etching. In this step, an organic alkaline solution is used as an etching solution. The resist layer 310 is soluble in the organic alkaline solution. Conversely, the conductive film 142 has an etching resistance to the organic alkaline solution. Therefore, while the resist layer 310 is dissolved, the conductive film 141 can be etched in a desired shape by using the conductive film 142 as a mask. Further, although the resist layer 310 is gradually dissolved, FIG. 6C illustrates a state in which the resist layer 310 is completely dissolved. After the conductive film 141 is etched, the gate insulating film 13 is etched by using the gate electrode 14B as a mask.

Moreover, in the step illustrated in FIG. 6C, the conductive film 142 serves as an etching mask. Therefore, for example, after the step illustrated in FIG. 6B is performed, the resist layer 310 may be preliminarily removed by etching, and subsequently, the conductive film 141 may be etched by using the conductive film 142 as the etching mask.

In the step illustrated in FIG. 6C, the width of the conductive film 141 can be made narrower than the width of the conductive film 142 by controlling a wet etching process (such as an etching time). Namely, an undercut (a difference in width between the conductive film 141 and the conductive film 142 illustrated in the cross section of FIG. 6C) can be formed.

Accordingly, the gate electrode 14B and the gate insulating film 13 can be etched by performing a single mask production process (namely, a process for forming the resist layer 310) only. Namely, unlike conventional techniques, separate masks are not required to be produced for etching of the gate electrode 14B and for etching of the gate insulating film 13.

Herein, performing etching by a single mask production process may be expressed as "etching using the same mask." Namely, the expression "etching using the same mask" includes a case in which a plurality of layers are etched by using the same resist layer as an etching mask, and also includes a case in which a lower layer is etched by using an upper layer as a mask when the resist layer is dissolved while the lower layer is being etched.

After the step illustrated in FIG. 6C, by performing steps similar to those described in FIG. 3A through FIG. 3C, the self-aligned top-gate field-effect transistor 10B illustrated in FIG. 5 is produced.

The field-effect transistor 10B of the third embodiment has a similar structure to that of the field-effect transistor 10 of the first embodiment. Therefore, the field-effect transistor 10B can be miniaturized.

Further, in the field-effect transistor 10B, the gate electrode 14B has the undercut. In a case where the source electrode 15, the drain electrode 16, and the gate electrode covering layer 17 are formed by sputtering, sputter particles hardly reach the undercut portion. This ensures that the source electrode 15 and the drain electrode 16 are separated from the gate electrode covering layer 17. Also, the thickness of the source electrode 15 and of the drain electrode 16 is smaller than the thickness of the gate insulating film 13. Because of this synergistic effect, it is possible to suppress a leakage current between the source electrode 15 and the gate electrode 14B and also a leakage current between the drain electrode 16 and the gate electrode 14B. Therefore, favorable transistor characteristics can be obtained.

However, in the field-effect transistor 10B, the thickness of the source electrode 15 and of the drain electrode 16 is not required to be smaller than the thickness of the gate insulating film 13. In the field-effect transistor 10B, the thickness of the source electrode 15 and of the drain electrode 16 is smaller than the total thickness of the gate insulating film 13 and the gate electrode 14B excluding the upper layer (namely, the thickness of the gate insulating film 13 plus the thickness of the conductive film 141). This prevents the gate electrode 14B from making contact with the source electrode 15 and the drain electrode 16.

Fourth Embodiment

A fourth embodiment illustrates another example in which a gate electrode has an undercut. In the fourth embodiment, a description of the same elements as those of the above-described embodiments may be omitted.

<Structure of Field-Effect Transistor>

FIG. 7 is a cross-sectional view illustrating a field-effect transistor of the fourth embodiment. A difference between a field-effect transistor 10C illustrated in FIG. 7 and the field-effect transistor 10 (see FIG. 1A) is that the gate electrode 14 is replaced with a gate electrode 14C.

The gate electrode 14C has an undercut. Namely, the gate electrode 14C has a region whose width is narrower than the width of the gate insulating film 13.

In the example of FIG. 7, the gate electrode 14C is a multi-layer film in which a conductive film 142 and a conductive film 143 are sequentially laminated on a conductive film 141. In the multi-layer film constituting the gate electrode 14C, widths of the layers become narrower layer by layer toward a gate insulating film 13. To be more specific, the width of the conductive film 141 is narrower than the width of the conductive film 142. Therefore, the outer edge portion of the lower surface of the conductive film 142 protrudes from the periphery of the upper surface of the conductive film 141. Also, the width of the conductive film 142 is narrower than the width of the conductive film 143. Therefore, the outer edge portion of the lower surface of the conductive film 143 protrudes from the periphery of the upper surface of the conductive film 142. Also, the width of the conductive film 141 is narrower than the width of the gate insulating film 13. Therefore, the outer edge portion of the upper surface of the gate insulating film 13 protrudes from the periphery of the lower surface of the conductive film 141.

An undercut amount (a difference in width between the conductive film 141 and the conductive film 142 illustrated in the cross section of FIG. 7) can be set to approximately 100 nm to a few hundred nm, for example. Also, an undercut amount (a difference in width between the conductive film 142 and the conductive film 143 illustrated in the cross section of FIG. 7) can be set to approximately 100 nm to a few hundred nm, for example.

The materials and the thicknesses of the conductive films 141 and 142 are as described above. A material of the conductive film 143 is not particularly limited and may be appropriately selected depending on the purpose. For example, it is possible to use metals, alloys, mixtures of a plurality of metals, and conductive films other than metal films, which have an etching resistance to an organic alkaline solution and also have a higher etching rate for a predetermined etching solution than the conductive film 142. Examples of the material include metals such as molybdenum (Mo), tungsten (W), titanium (Ti), tantalum (Ta), chromium (Cr), copper (Cu), and nickel (Ni), alloys thereof, mixtures of these metals, and oxide films having conductivity. An average thickness of the conductive film 143 is not particularly limited and may be appropriately selected depending on the purpose, but is preferably 10 nm to 200 nm and more preferably 50 nm to 100 nm.

<Method for Producing Field-Effect Transistor>

In order to produce the field-effect transistor 10C, steps similar to those described in FIG. 2A and FIG. 2B of the first embodiment are performed first. Next, in a step illustrated in FIG. 8A, after a resist layer 300 is removed, a gate insulating film 13 covering a semiconductor film 12 is formed over the entire surface of a base 11. Further, the conductive film 141, the conductive film 142, and the conductive film 143 are sequentially laminated on the gate insulating film 13. A method for forming the gate insulating film 13 is as described above. A method for forming the conductive film 143 can be the same as the method for forming the conductive films 141 and 142.

As an example herein, a material (an Al alloy, for example) that can be etched by using an organic alkaline solution as an etching solution is selected as a material of the conductive film 141. A material (a Mo alloy, for example) that has an etching resistance to the organic alkaline solution and also has a higher etching rate for a predetermined etching solution than the conductive film 141 is selected as a material of the conductive film 142. Further, a material (Ti, for example) that has an etching resistance to the organic alkaline solution and also has a higher etching rate for a predetermined etching solution than the conductive film 142 is selected as a material of the conductive film 143.

After the conductive film 143 is formed, a resist made of a photosensitive resin is formed on the entire surface of the conductive film 143, and is subjected to the exposure and development process (photolithography process). As a result, a resist layer 310 (etching mask) covering a predetermined region on the conductive film 143 is formed.

Next, in a step illustrated in FIG. 8B, using the resist layer 310 as the etching mask, a region of the conductive film 143 that is not covered by the resist layer 310 is removed by etching. By performing etching using an etching solution whose etching rate is higher for the conductive film 143 than for the conductive film 142, only the region of the conductive film 143 that is not covered by the resist layer 310 can be removed by etching. At this time, the conductive film 142 is hardly etched. The ratio of the etching rate of the conductive film 142 to the etching rate of the conductive film 143 is preferably at least 1:10. Further, the resist layer 310 has an etching resistance to the etching solution used in this step.

Next, in a step illustrated in FIG. 8C, using the resist layer 310 as the etching mask, a region of the conductive film 142 that is not covered by the resist layer 310 is removed by etching. By performing etching using an etching solution whose etching rate is higher for the conductive film 142 than for the conductive film 141, only the region of the conductive film 142 that is not covered by the resist layer 310 can be removed by etching. At this time, the conductive film 141 is hardly etched. The ratio of the etching rate of the conductive film 141 to the etching rate of the conductive film 142 is preferably at least 1:10. Further, the resist layer 310 has an etching resistance to the etching solution used in this step.

Next, in a step illustrated in FIG. 8D, a region of the conductive film 141 that is not covered by the conductive films 142 and 143 is removed by etching. In this step, an organic alkaline solution is used as an etching solution. The resist layer 310 is soluble in the organic alkaline solution. Conversely, the conductive films 142 and 143 have an etching resistance to the organic alkaline solution. Therefore, while the resist layer 310 is dissolved, the conductive film 141 can be etched in a desired shape by using the conductive films 142 and 143 as a mask. Further, although the resist layer 310 is gradually dissolved, FIG. 8D illustrates a state in which the resist layer 310 is completely dissolved. After the conductive film 141 is etched, the gate insulating film 13 is etched by using the gate electrode 14C as a mask.

Moreover, in the step illustrated in FIG. 8D, the conductive films 142 and 143 serve as an etching mask. Therefore, for example, after the step illustrated in FIG. 8B or FIG. 8C is performed, the resist layer 310 may be preliminarily removed by etching, and subsequently, the conductive film 141 may be etched by using the conductive films 142 and 143 as an etching mask.

In the step illustrated in FIG. 8D, by controlling a wet etching process (such as an etching time), the width of the conductive film 142 can be made narrower than the width of the conductive film 143, and further the width of the conductive film 141 can be made narrower than the width of the conductive film 142. Namely, an undercut (a difference in width between the conductive film 141 and the conductive film 143 illustrated in the cross section of FIG. 8D) can be formed wider.

Accordingly, the gate electrode 14C and the gate insulating film 13 can be etched by performing a single mask production process (namely, a process for forming the resist layer 310) only. Namely, unlike conventional techniques, separate masks are not required to be produced for etching of the gate electrode 14C and for etching of the gate insulating film 13.

After the step illustrated in FIG. 8D, by performing steps similar to those described in FIG. 3A through FIG. 3C, the self-aligned top-gate field-effect transistor 10C illustrated in FIG. 7 is produced.

The field-effect transistor 10C of the fourth embodiment has a similar structure to that of the field-effect transistor 10 of the first embodiment. Therefore, the field-effect transistor 10C can be miniaturized.

Further, because the gate electrode 14C of the field-effect transistor 10C has a three-layer structure, etching conditions of the layers can be more easily adjusted than the gate electrode 14B having a two-layer structure. Therefore, an undercut amount of the field-effect transistor 10C can be increased further than that of the field-effect transistor 10B. Accordingly, in a case where the source electrode 15, the drain electrode 16, and the gate electrode covering layer 17 are formed by sputtering, sputter particles hardly reach the undercut portion.

This further ensures that the source electrode 15 and the drain electrode 16 are separated from the gate electrode covering layer 17. Also, the thickness of the source electrode 15 and of the drain electrode 16 is smaller than the thickness of the gate insulating film 13. Because of this synergistic effect, it is possible to suppress a leakage current between the source electrode 15 and the gate electrode 14B and also a leakage current between the drain electrode 16 and the gate electrode 14C. Therefore, favorable transistor characteristics can be obtained.

However, in the field-effect transistor 10C, the thickness of the source electrode 15 and of the drain electrode 16 is not required to be smaller than the thickness of the gate insulating film 13. In the field-effect transistor 10C, the thickness of the source electrode 15 and the drain electrode 16 is smaller than the total thickness of the gate insulating film 13 and the gate electrode 14C excluding the uppermost layer (namely, the thickness of the gate insulating film 13 plus the thickness of the conductive film 141 plus the thickness of the conductive film 142). This prevents the gate electrode 14C from making contact with the source electrode 15 and the drain electrode 16.

Fifth Embodiment

A fifth embodiment illustrates an example of a gate electrode having a two-layer structure in which an upper electrode layer has a narrower pattern width than a pattern width of a lower electrode layer. In the fifth embodiment, a description of the same elements as those of the above-described embodiments may be omitted.

<Structure of Field-Effect Transistor>

FIG. 9 is a cross-sectional view illustrating a field-effect transistor of the fifth embodiment. A difference between a field-effect transistor 10D illustrated in FIG. 9 and the field-effect transistor 10 (see FIG. 1A) is that the gate electrode 14 is replaced with a gate electrode 14D.

The gate electrode 14D has two electrode layers. In the example of FIG. 9, the gate electrode 14D is a multi-layer film in which a conductive film 142 is laminated on a conductive film 141. In the multi-layer film constituting the gate electrode 14D, widths of the layers become narrower layer by layer toward a gate insulating film 13. To be more specific, the width of the conductive film 141 is narrower than the width of the conductive film 142. Therefore, the outer edge portion of the upper surface of the conductive film 141 protrudes from the periphery of the lower surface of the conductive film 142.

A material of the conductive film 141 is not particularly limited and may be appropriately selected depending on the purpose. For example, it is possible to use metals, alloys, mixtures of a plurality of metals, and conductive films other than metal films, which can be etched by using an organic alkaline solution as an etching solution. Examples of the material include aluminum (Al), Al alloys (alloys mainly containing Al), and oxide films having conductivity.

Examples of the organic alkaline solution include strong alkaline solutions such as tetramethyl ammonium hydroxide (TMAH-based), 2-hydroxyethyl trimethylammonium hydroxide (CHOLINE-based), and monoethanolamine solutions.

A material of the conductive film 142 is not particularly limited and may be appropriately selected depending on the purpose. For example, it is possible to use metals, alloys, mixtures of a plurality of metals, and conductive films other than metal films, which have an etching resistance to an organic alkaline solution and also have a higher etching rate for a predetermined etching solution than the conductive film 141. Examples of the material include metals such as molybdenum (Mo), tungsten (W), titanium (Ti), tantalum (Ta), chromium (Cr), copper (Cu), and nickel (Ni), alloys thereof, mixtures of these metals, and oxide films having conductivity.

An average thickness of the conductive film 141 is not particularly limited and may be appropriately selected depending on the purpose, but is preferably 10 nm to 200 nm and more preferably 50 nm to 100 nm. An average thickness of the conductive film 142 is not particularly limited and may be appropriately selected depending on the purpose, but is preferably 10 nm to 200 nm and more preferably 50 nm to 100 nm.

<Method for Producing Field-Effect Transistor>

In order to produce the field-effect transistor 10D, steps similar to those described in FIG. 2A and FIG. 2B of the first embodiment are performed, and a resist layer 300 is removed. Next, in the step illustrated in FIG. 6A, a gate insulating film 13 covering a semiconductor film 12 is formed over the entire surface of a base 11. Further, the conductive film 141 and the conductive film 142 are sequentially laminated on the gate insulating film 13. A method for forming the gate insulating film 13 is as described above.

A method for forming the conductive films 141 and 142 is not particularly limited and may be appropriately selected depending on the purpose. Examples of the method include a vacuum process such as a sputtering method, a pulse laser deposition (PLD) method, a chemical vapor deposition (CVD) method, and an atomic layer deposition (ALD) method, and also include a solution process such as a dip coating method, a spin coating method, and a die coating method. Other examples include a printing process such as an inkjet printing, a nanoimprinting, and a gravure printing.

As an example herein, a material (an Al alloy, for example) that can be etched by using an organic alkaline solution as an etching solution is selected as a material of the conductive film 141. A material (a Mo alloy, for example) that has a higher etching rate for a predetermined etching solution than the conductive film 141 is selected as a material of the conductive film 142.

After the conductive film 142 is formed, a resist made of a photosensitive resin is formed on the entire surface of the conductive film 142 and is subjected to the exposure and development process (photolithography process). As a result, a resist layer 310 (etching mask) covering a predetermined region on the conductive film 142 is formed.

Next, in a step illustrated in FIG. 6B, using the resist layer 310 as the etching mask, a region of the conductive film 142 that is not covered by the resist layer 310 is removed by etching. By performing etching using an etching solution whose etching rate is higher for the conductive film 142 than for the conductive film 141, only the region of the conductive film 142 that is not covered by the resist layer 310 can be removed by etching. At this time, the conductive film 141 is hardly etched. The ratio of the etching rate of the conductive film 141 to the etching rate of the conductive film 142 is preferably at least 1:10. Further, the resist layer 310 has an etching resistance to the etching solution used in this step.

Next, in the step illustrated in FIG. 6C, a region of the conductive film 141 that is not covered by the conductive film 142 is removed by etching. In this step, an organic alkaline solution is used as an etching solution. The resist layer 310 is soluble in the organic alkaline solution. Conversely, the conductive film 142 has an etching resistance to the organic alkaline solution. Therefore, while the resist layer 310 is dissolved, the conductive film 141 can be etched in a desired shape by using the conductive film 142 as a mask. Further, although the resist layer 310 is gradually dissolved, FIG. 6C illustrates the state in which the resist layer 310 is completely dissolved. After the conductive film 141 is etched, the gate insulating film 13 is etched by using the gate electrode 14D as a mask.

Moreover, in the step illustrated in FIG. 6C, the conductive film 142 serves as an etching mask. Therefore, for example, after the step illustrated in FIG. 6B is performed, the resist layer 310 may be preliminarily removed by etching, and subsequently, the conductive film 141 may be removed by etching using the conductive film 142 as the etching mask.

Accordingly, the gate electrode 14D and the gate insulating film 13 can be etched by performing a single mask production process (namely, a process for forming the resist layer 310) only. Namely, unlike conventional techniques, separate masks are not required to be produced for etching of the gate electrode 14D and for etching of the gate insulating film 13.

After the step illustrated in FIG. 6C, by performing steps similar to those described in FIG. 3A through FIG. 3C, the self-aligned top-gate field-effect transistor 10D illustrated in FIG. 9 is produced.

The field-effect transistor 10D of the fifth embodiment has a similar structure to that of the field-effect transistor 10 of the first embodiment. Therefore, the field-effect transistor 10D can be miniaturized.

Furthermore, the thickness of the source electrode 15 and of the drain electrode 16 are smaller than the thickness of the gate insulating film 13. This prevents the source electrode 15 and the drain electrode 16 from making contact with the gate electrode 14D. Also, because the source electrode 15 and the drain electrode 16 are thin, a difference in level is formed between the source electrode 15 and the gate electrode covering layer 17 and also between the drain electrode 16 and the gate electrode covering layer 17. Accordingly, it is possible to suppress a leakage current between the source electrode 15 and the gate electrode 14D and also a leakage current between the drain electrode 16 and the gate electrode 14D. Therefore, favorable transistor characteristics can be obtained.

Sixth Embodiment

A sixth embodiment illustrates another example of a gate electrode having a three-layer structure in which a middle electrode layer has an undercut. In the sixth embodiment, a description of the same elements as those of the above-described embodiments may be omitted.

<Structure of Field-Effect Transistor>

FIG. 10 is a cross-sectional view illustrating a field-effect transistor of the sixth embodiment. A difference between a field-effect transistor 10E illustrated in FIG. 10 and the field-effect transistor 10 (see FIG. 1A) is that the gate electrode 14 is replaced with a gate electrode 14E.

The gate electrode 14E has a three-layer structure in which a middle electrode layer has an undercut. In the example of FIG. 10, the gate electrode 14E is a multi-layer film in which a conductive film 142 and a conductive film 143 are sequentially laminated on a conductive film 141. In the multi-layer film constituting the gate electrode 14E, the width of the conductive film 142 is narrower than the widths of the conductive film 141 and the conductive film 143.

An undercut amount (a difference in width between the conductive film 142 and the conductive film 143 illustrated in the cross section of FIG. 10) can be set to approximately 100 nm to a few hundred nm, for example.

The materials and the thicknesses of the conductive films 141 and 142 are as described above. A material of the conductive film 143 is not particularly limited and may be appropriately selected depending on the purpose. For example, it is possible to use metals, alloys, mixtures of a plurality of metals, and conductive films other than metal films, which have an etching resistance to an organic alkaline solution and also have a higher etching rate for a predetermined etching solution than the conductive film 142. Examples of the material include metals such as molybdenum (Mo), tungsten (W), titanium (Ti), tantalum (Ta), chromium (Cr), copper (Cu), and nickel (Ni), alloys thereof, mixtures of these metals, and oxide films having conductivity. An average thickness of the conductive film 143 is not particularly limited and may be appropriately selected depending on the purpose, but is preferably 10 nm to 200 nm and more preferably 50 nm to 100 nm.

<Method for Producing Field-Effect Transistor>

In order to produce the field-effect transistor 10E, steps similar to those described in FIG. 2A and FIG. 2B of the first embodiment are performed, and a resist layer 300 is removed. Next, in the step illustrated in FIG. 8A, a gate insulating film 13 covering a semiconductor film 12 is formed over the entire surface of a base 11. Further, the conductive film 141, the conductive film 142, and the conductive film 143 are sequentially laminated on the gate insulating film 13. A method for forming the gate insulating film 13 is as described above. A method for forming the conductive film 143 can be the same as the method for forming the conductive films 141 and 142.

As an example herein, a material (an Al alloy, for example) that can be etched by using an organic alkaline solution as an etching solution is selected as a material of the conductive film 141. A material (a Mo alloy, for example) that has an etching resistance to the organic alkaline solution and also has a higher etching rate for a predetermined etching solution than the conductive film 141 is selected as a material of the conductive film 142. Further, a material (Ti, for example) that has an etching resistance to the organic alkaline solution and also has a higher etching rate for a predetermined etching solution than the conductive film 142 is selected as a material of the conductive film 143.

After the conductive film 143 is formed, a resist made of a photosensitive resin is formed on the entire surface of the conductive film 143, and is subjected to the exposure and development process (photolithography process). As a result, the resist layer 310 (etching mask) covering a predetermined region on the conductive film 143 is formed.

Next, in the step illustrated in FIG. 8B, using the resist layer 310 as the etching mask, a region of the conductive film 143 that is not covered by the resist layer 310 is removed by etching. By performing etching using an etching solution whose etching rate is higher for the conductive film 143 than for the conductive film 142, only the region of the conductive film 143 that is not covered by the resist layer 310 can be removed by etching. At this time, the conductive film 142 is hardly etched. The ratio of the etching rate of the conductive film 142 to the etching rate of the conductive film 143 is preferably at least 1:10. Further, the resist layer 310 has an etching resistance to the etching solution used in this step.

Next, in a step illustrated in FIG. 8C, using the resist layer 310 as the etching mask, a region of the conductive film 142 that is not covered by the resist layer 310 is removed by etching. By performing etching using an etching solution whose etching rate is higher for the conductive film 142 than for the conductive film 141, only the region of the conductive film 142 that is not covered by the resist layer 310 can be removed by etching. At this time, the conductive film 141 is hardly etched. The ratio of the etching rate of the conductive film 141 to the etching rate of the conductive film 142 is preferably at least 1:10. Further, the resist layer 310 has an etching resistance to the etching solution used in this step.

Next, in the step illustrated in FIG. 8D, a region of the conductive film 141 that is not covered by the conductive films 142 and 143 is removed by etching. In this step, an organic alkaline solution is used as an etching solution. The resist layer 310 is soluble in the organic alkaline solution. Conversely, the conductive films 142 and 143 have an etching resistance to the organic alkaline solution. Therefore, while the resist layer 310 is dissolved, the conductive film 141 can be etched in a desired shape by using the conductive films 142 and 143 as a mask. Further, although the resist layer 310 is gradually dissolved, FIG. 8D illustrates a state in which the resist layer 310 is completely dissolved. After the conductive film 141 is etched, the gate insulating film 13 is etched by using the gate electrode 14E as a mask.

Moreover, in the step illustrated in FIG. 8D, the conductive films 142 and 143 serve as an etching mask. Therefore, for example, after the step illustrated in FIG. 8B or FIG. 8C is performed, the resist layer 310 may be preliminarily removed by etching, and subsequently, the conductive film 141 may be etched by using the conductive films 142 and 143 as an etching mask.

Accordingly, the gate electrode 14E and the gate insulating film 13 can be etched by performing a single mask production process (namely, a process for forming the resist layer 310) only. Namely, unlike conventional techniques, separate masks are not required to be produced for etching of the gate electrode 14E and for etching of the gate insulating film 13.

After the step illustrated in FIG. 8D, by performing steps similar to those described in FIG. 3A through FIG. 3C, the self-aligned top-gate field-effect transistor 10E illustrated in FIG. 10 is produced.

The field-effect transistor 10E of the sixth embodiment has a similar structure to that of the field-effect transistor 10 of the first embodiment. Therefore, the field-effect transistor 10E can be miniaturized.

Also, the thickness of the source electrode 15 and of the drain electrode 16 is smaller than the thickness of the gate insulating film 13. This prevents the gate electrode 14E from making contact with the source electrode 15 and the drain electrode 16. Also, because the source electrode 15 and the drain electrode 16 are thin, a difference in level is formed between the source electrode 15 and the gate electrode covering layer 17 and also between the drain electrode 16 and the gate electrode covering layer 17. This ensures that the source electrode 15 and the drain electrode 16 are separated from the gate electrode covering layer 17. Accordingly, it is possible to suppress a leakage current between the source electrode 15 and the gate electrode 14E and also a leakage current between the drain electrode 16 and the gate electrode 14E. Therefore, favorable transistor characteristics can be obtained.

Example 1

In Example 1, a top-gate field-effect transistor as illustrated in FIG. 4 was produced by using the production process illustrated in FIGS. 2A through 2D and FIGS. 3A through 3C.

First, 0.1 mol (35.488 g) of indium nitrate ($In(NO_3)_3 \cdot 3H_2O$) was weighed and was dissolved in 100 ml of ethylene glycol monomethyl ether to obtain solution A. Also, 0.02 mol (7.503 g) of aluminum nitrate ($Al(NO3)_3 \cdot 9H_2O$) was weighed and was dissolved in 100 ml of ethylene glycol monomethyl ether to obtain solution B. Further, 0.005 mol (1.211 g) of rhenium oxide ($Re_2O_7$) was weighed and 500 ml of ethylene glycol monomethyl ether was dissolved in 500 ml of ethylene glycol monomethyl ether to obtain solution C. Solution A (199.9 ml), solution B (50 ml), and solution C (10 ml), and 1,2-propanediol (420 ml) were mixed and stirred at room temperature to make a coating solution for producing a n-type oxide semiconductor. Next, the above-described coating solution for producing the n-type oxide semiconductor was applied to the base 11 by an inkjet printing method, and was baked at 300° C. for one hour at atmospheric pressure. The thickness of the resultant semiconductor film 12 was 50 nm. Next, a resist layer 300 serving as a mask was formed on the semiconductor film 12 and the semiconductor film 12 was patterned by photolithography and etching.

Next, in 1 ml of toluene, 1.10 ml of Lanthanum 2-ethylhexanoate toluene solution (a LA content of 7%, Wako 122-03371, available from Wako Chemical Ltd.) and 0.30 ml of strontium 2-ethylhexanoate toluene solution (a Sr content of 2%, Wako 195-09561, available from Wako Chemical Ltd.) were mixed to obtain a coating solution for forming a gate insulating film.

Next, 0.4 ml of the coating solution for forming the gate insulating film was dropped and spin-coated on the base 11 and the semiconductor film 12 under predetermined conditions (spinning was performed at 500 rpm for 5 seconds followed by 3,000 rpm for 20 seconds, and brought to a stop at 0 rpm in 5 seconds). Next, the resultant film was dried at 120° C. for 1 hour at atmospheric pressure, baked at 400° C. for 3 hours in an $O_2$ atmosphere, and annealed at 50° C. for 1 hour at atmospheric pressure to form an oxide film as a gate insulating film 13. The average thickness of the gate insulating film 13 was approximately 110 nm.

Next, as a gate electrode 14, an Al alloy film was formed on the gate insulating film 13 by a sputtering method. Next, a resist layer 310 serving as a mask was formed on the gate electrode 14. The gate insulating film 13 and the gate electrode 14 were patterned by photolithography and etching. At this time, an overhang shape illustrated in FIG. 4 was formed by adjusting the etching process.

Next, as a source electrode 15 and a drain electrode 16, Al alloy films were formed by the sputtering method. A gate electrode covering layer 17 made of the same material as the material of the source electrode 15 and the drain electrode 16 and having nearly the same thickness as the thickness of the source electrode 15 and the drain electrode 16 was formed on the gate electrode 14.

Next, a resist layer 320 serving as a mask was formed on the source electrode 15, the drain electrode 16, and the gate electrode covering layer 17. The source electrode 15 and the drain electrode 16 were patterned by photolithography and etching.

By removing the resist layer 320, a self-aligned top-gate field-effect transistor was produced.

Example 2

In Example 2, a top-gate field-effect transistor as illustrated in FIG. 4 was produced by the process illustrated in FIGS. 2A through 2D and FIGS. 3A through 3C in the same manner as Example 1, except that a Mo alloy film was formed as a source electrode 15, a drain electrode 16, and a gate electrode covering layer 17 by the sputtering method.

Example 3

In Example 3, a top-gate field-effect transistor as illustrated in FIG. 4 was produced by the process illustrated in FIGS. 2A through 2D and FIGS. 3A through 3C in the same manner as Example 1, except that Mg—In based oxide was formed as a semiconductor film 12 by the sputtering method.

To be more specific, an In-based oxide semiconductor film (semiconductor layer) was formed on a base 11 made of glass by the sputtering method.

A polycrystalline sintered material having a composition of $In_2MgO_4$ was used as a sputtering target. The ultimate vacuum in a sputter chamber was set to $2\times10^{-5}$ Pa. The flow rates of argon gas and oxygen gas used during sputtering were adjusted and the total pressure was set to 0.3 Pa. By adjusting the flow rate of oxygen, the amount of oxygen in the oxide semiconductor film was controlled and the electron carrier density was also controlled. The thickness of the resultant oxide semiconductor film (semiconductor layer) was 50 nm.

Example 4

In Example 4, a top-gate field-effect transistor as illustrated in FIG. 4 was produced by the process illustrated in FIGS. 2A through 2D and FIGS. 3A through 3C in the same manner as Example 1, except that a gate insulating film 13 consisting of a $SiO_2$ film was formed by a CVD method.

Comparative Example 1

In Comparative Example 1, a top-gate field-effect transistor as illustrated in FIG. 4 was produced by the process illustrated in FIGS. 2A through 2D and FIGS. 3A through 3C in the same manner as Example 1, except that the thickness of the source electrode 15, the drain electrode 16, and the gate electrode covering layer 17 was formed larger than the thickness of the gate insulating film 13.

Comparative Example 2

In Comparative Example 2, after a gate insulating film 13 was formed in the same manner as Example 1, a first mask was formed on the gate insulating film 13 and the gate insulating film 13 was patterned by photolithography and etching. Next, after the first mask was removed and a gate electrode 14 was formed on the patterned gate insulating film 13 in the same manner as Example 1, a second mask was formed on the gate electrode 14 and the gate electrode 14 was patterned by photolithography and etching. The other steps described in Example 1 were performed in accordance with the production process illustrated in FIGS. 2A through 2D and FIGS. 3A through 3C. Accordingly, a top-gate field-effect transistor as illustrated in FIG. 4 was produced.

<Evaluation of Field-Effect Transistor>

The performance of the field-effect transistors obtained in Examples 1 through 4 and Comparative Examples 1 and 2 was evaluated using a semiconductor parameter analyzer (B1500 semiconductor parameter analyzer, available from Agilent Technologies). To be more specific, with a source-drain voltage (Vds) being set to 10 V and the gate voltage (Vg) being changed from −15V to +15V, a source-drain current (Ids) and gate current (Ig) leakage (Ig leakage) were measured to evaluate current-voltage characteristics. Table 1 illustrates the evaluation results, along with the number of masks used to produce the field-effect transistors in the respective examples.

TABLE 1

| | EXAMPLE 1 | EXAMPLE 2 | EXAMPLE 3 | EXAMPLE 4 | COMPARATIVE EXAMPLE 1 | COMPARATIVE EXAMPLE 2 |
|---|---|---|---|---|---|---|
| IG LEAKAGE | ACCEPTABLE | ACCEPTABLE | ACCEPTABLE | ACCEPTABLE | NOT ACCEPTABLE | ACCEPTABLE |
| NO. OF MASKS | 3 | 3 | 3 | 3 | 3 | 4 |

As illustrated in Table 1, in the field-effect transistors produced in Examples 1 through 4 and Comparative Example 2, values of the Ig leakage presented no problem. However, in the field-effect transistor produced in Comparative Example 1, values of the Ig leakage exceeded an acceptable value. Also, in Comparative Example 2, although the value of the Ig leakage presented no problem, four masks were required. As compared to Examples 1 through 4 in which the number of masks used was three, the production process of the field-effect transistor in Comparative Example 2 was complicated and thus was unfavorable.

Further, the results of the performance evaluation of the transistors presented that the insulation was maintained and favorable transistor characteristics were obtained as illustrated in FIG. 11. Although FIG. 11 illustrates characteristics of the field-effect transistor produced in Example 1, the field-effect transistors produced in Examples 2 through 4 presented substantially the same characteristics.

Seventh Embodiment

A seventh embodiment illustrates an example of a display element using the field-effect transistor of the first embodiment, a display device, and a system. In the seventh embodiment, a description of the same elements as those of the above-described embodiment may be omitted.

(Display Element)

The display element of the seventh embodiment at least includes a light control element and a driving circuit configured to drive the light control element. The display element further includes other members as necessary. The light control element is not particularly limited and may be appropriately selected depending on the purpose as long as the light control element is an element configured to control light output in accordance with a driving signal. Examples of the light control element include an electroluminescent (EL) element, an electrochromic (EC) element, a liquid crystal element, an electrophoretic element, and an electrowetting element.

The driving circuit is not particularly limited and may be appropriately selected depending on the purpose. Other members are not particularly limited and may be appropriately selected depending on the purpose.

Because the display element of the seventh embodiment has the field-effect transistor of the first embodiment, the field-effect transistor can be miniaturized. Accordingly, the display element can be downsized.

Also, in the field-effect transistor of the first embodiment, because the parasitic capacitance can be reduced, the switching characteristics can be improved, and also because the leakage current can be suppressed, favorable transistor characteristics can be provided. Accordingly, the display element of the seventh embodiment has high display qualities.

(Display Device)

The display device of the seventh embodiment at least includes a plurality of display elements of the seventh embodiment, a plurality of wires, and a display control unit. The display device further includes other members as necessary. The plurality of display elements are not particularly limited and may be appropriately selected depending on the purpose, as long as the plurality of display elements are the display elements of the seventh embodiment arranged in a matrix form.

The plurality of wires are not particularly limited and may be appropriately selected depending on the purpose, as long as the plurality of wires are capable of individually applying a gate voltage and supplying an image data signal to the field-effect transistors in the plurality of display elements.

The display control unit is not particularly limited and may be appropriately selected depending on the purpose, as long as the display control is capable of individually controlling the gate voltage and the signal voltage of the field-effect transistor via the plurality of wires based on the image data. Other members are not particularly limited and may be appropriately selected depending on the purpose.

Because the display device of the seventh embodiment includes the field-effect transistor of the first embodiment, the display device can display high-quality images.

(System)

The system of the seventh embodiment at least includes the display apparatus of the seventh embodiment and an image data generating device. The image data generating device generates image data based on image information to be displayed and outputs the image data to the display device.

Because the system includes the display device according to the seventh embodiment, high-definition image information can be displayed.

The display element, the display device, and the system of the seventh embodiment will be specifically described below.

FIG. 12 illustrates a schematic block configuration of the television apparatus of the seventh embodiment. Connecting lines illustrated in FIG. 12 are for illustrating a flow of typical signals and information, and are not for illustrating the entire connection relationship between the blocks.

A television apparatus 500 of the seventh embodiment includes a main controller 501, a tuner 503, an analog-digital converter (ADC) 504, a demodulating circuit 505, a transport stream (TS) decoder 506, an audio decoder 511, a digital-to-analog (DA) converter (DAC) 512, an audio output circuit 513, a speaker 514, a video decoder 521, a video/OSD synthesizing circuit 522, a video output circuit 523, a display device 524, an OSD rendering circuit 525, a memory 531, an operating device 532, a drive interface (drive IF) 541, a hard disk drive 542, an optical disc drive 543, an IR photodetector 551, a communication controller 552, and the like.

The main controller 501 controls the entire television apparatus 500, and includes a CPU, flash ROM, RAM, and the like. The flash ROM stores a program written in code that can be decoded by the CPU, and also stores various types of data used for processing by the CPU. The RAM is working memory.

The tuner 503 selects a preset channel from broadcast waves received by an antenna 610. The ADC 504 converts an output signal (analog information) of the tuner 503 to digital information. The demodulating circuit 505 demodulates the digital information from the ADC 504.

The TS decoder 506 decodes an output signal from the demodulating circuit 505 and separates the output signal into sound information and video information. The audio decoder 511 decodes the sound information from the TS decoder 506. The DA converter (DAC) 512 converts an output signal from the audio decoder 511 to an analog signal.

The audio output circuit 513 outputs the output signal from the DA converter (DAC) 512 to the speaker 514. The video decoder 521 decodes the video information from the TS decoder 506. The video-OSD synthesizing circuit 522 synthesizes an output signal from the video decoder 521 and an output signal from the OSD rendering circuit 525.

The video output circuit 523 outputs an output signal from the video-OSD synthesizing circuit 522 to the display device 524. The OSD rendering circuit 525 includes a character generator for displaying characters and graphics on a screen of the display device 524. Also, the OSD rendering circuit 525 generates a signal including display information according to instructions from the operating device 532 and the IR photodetector 551.

The memory 531 temporarily stores audio-visual (AV) data and other data. The operating device 532 includes an input medium (not illustrated) such as a control panel, and indicates various types of information input by a user to the main controller 501. The drive IF 541 is an interactive communication interface. For example, the drive IF 541 is compatible with the ATAPI (AT attachment packet interface).

The hard disk drive 542 includes a hard disk and a driving device configured to drive the hard disk. The driving device records data on the hard disk and reproduces the data recorded on the hard disk. The optical disc drive 543 records data on an optical disc (a DVD, for example) and reproduces the data recorded on the optical disc.

The IR photodetector 551 receives a photosignal from a remote control transmitter 620, and notifies the photosignal to the main controller 501. The communication controller 552 controls communication with the Internet. Various types of information can be obtained via the Internet.

As illustrated in FIG. 13 by way of example, the display device 524 includes a display unit 700 and a display control unit 780. As illustrated in FIG. 14 by way of example, the display unit 700 includes a display 710 in which a plurality of display elements 702 are arranged in a matrix form (herein, n×m number of display elements).

Also, as illustrated in FIG. 15 by way of example, the display 710 includes n number of scanning lines (X0, X1, X2, X3, . . . , Xn-2, Xn-1) arranged along the x-axis direction at regular intervals, m number of data lines (Y0, Y1, Y2, Y3, . . . , Ym-1) arranged along the y-axis direction at regular intervals, and m number of current supply lines arranged along the y-axis direction at regular intervals (Y0i, Y1i, Y2i, Y3i, . . . , Ym-1i). The display elements 702 can be identified by the scanning lines and the data lines.

As illustrated in FIG. 16 by way of example, the respective display elements 702 include an organic EL (electroluminescent) element 750 and a driving circuit 720 configured to cause the organic EL (electroluminescent) element 750 to emit light. Namely, the display 710 is an organic EL display of what is known as an active matrix system. Also, the display 710 is a 32-inch color display, but the size of the display 710 is not limited thereto.

As illustrated in FIG. 17 by way of example, the organic EL element 750 includes an organic EL thin film layer 740, a cathode 712, and an anode 714.

For example, the organic EL element 750 can be disposed next to the field-effect transistor. In this case, the organic EL element 750 and the field-effect transistor can be formed on the same base. However, the present invention is not limited thereto. For example, the organic EL element 750 may be disposed above the field-effect transistor. In this case, the gate electrode is required to have transparency. Therefore, a transparent oxide having conductivity, such as ITO, $In_2O_3$, $SnO_2$, ZnO, Ga-added ZnO, Al-added ZnO, and Sb-added $SnO_2$, is used for the gate electrode. In the organic EL element 750, aluminum (Al) is used for the cathode 712. Also, a magnesium (Mg)-silver (Ag) alloy, an aluminum (Al)-lithium (Li) alloy, indium tin oxide (ITO), and the like may be used. ITO is used for the anode 714. Further, an oxide having conductivity such as $In_2O_3$, $SnO_2$, and ZnO and a silver (Ag)-neodymium (Nd) alloy may be used.

The organic EL thin film layer 740 includes an electron transporting layer 742, a light emitting layer 744, and a hole transporting layer 746. The cathode 712 is connected to the electron transporting layer 742. The anode 714 is connected to the hole transporting layer 746. When a predetermined voltage is applied between the anode 714 and the cathode 712, the light emitting layer 744 emits light.

Also, as illustrated in FIG. 16, the driving circuit 720 includes two field-effect transistors 810 and 820 and a capacitor 830. The field-effect transistor 810 operates as a switching element. A gate electrode G is connected to a predetermined scanning line and a source electrode S is connected to a predetermined data line. Also, a drain electrode D is connected to one terminal of the capacitor 830.

The capacitor 830 is configured to store the state, namely data, of the field-effect transistor 810. The other terminal of the capacitor 830 is connected to a predetermined current supply line.

The field-effect transistor 820 is configured to supply a large current to the organic EL element 750. A gate electrode G is connected to the drain electrode D of the field-effect transistor 810. A drain electrode D is connected to the anode 714 of the organic EL element 750. A source electrode S is connected to a predetermined current supply line.

When the field-effect transistor 810 is turned on, the organic EL element 750 is driven by the field-effect transistor 820.

As illustrated in FIG. 18 by way of example, the display control unit 780 includes an image data processing circuit 782, a scanning line driving circuit 784, and a data line driving circuit 786.

The image data processing circuit 782 determines brightness of a plurality of display elements 702 in the display 710 based on an output signal from the video output circuit 523. The scanning line driving circuit 784 individually applies a voltage to n number of scanning lines in accordance with an instruction from the image data processing circuit 782. The data line driving circuit 786 individually applies a voltage to m number of data lines in accordance with an instruction from the image data processing circuit 782.

As is clear from the above description, in the television apparatus 500 of the present embodiment, the video decoder 521, the video-OSD synthesizing circuit 522, the video output circuit 523, and the OSD rendering circuit 525 constitute the image data generating device.

Although a case where the light control element is an organic EL element has been described above, the light control element is not limited thereto and may be a liquid crystal element, an electrochromic element, an electrophoretic element, or an electrowetting element.

For example, when the light control element is a liquid crystal element, a liquid crystal display is used as the above-described display 710. In this case, as illustrated in FIG. 19, a current supply line is not required for the display element 703.

Further, in this case, as illustrated in FIG. 20 by way of example, a driving circuit 730 can be formed by a single field-effect transistor 840, which is similar to the field-effect transistors (810 and 820) illustrated in FIG. 14. In the field-effect transistor 840, a gate electrode G is connected to a predetermined scanning line and a source electrode S is connected to a predetermined data line. Also, a drain electrode D is connected to a pixel electrode and a capacitor 760 of a liquid crystal element 770. Reference numerals 762 and 772 in FIG. 20 are counter electrodes (common electrodes) of the capacitor 760 and the liquid crystal element 770, respectively.

Moreover, instead of the field-effect transistor of the first embodiment, the driving circuit may include any of the field-effect transistors of the second through fourth embodiments.

Although a case where the system is a television apparatus has been described in the above embodiments, the system of the present invention is not limited thereto. Namely, the system is not limited as long as the system includes the display device 524 as a device configured to display images and information. For example, the system may be a computer system (including a personal computer) in which a computer is connected to the display device 524.

Also, the display device 524 can be used as a display part in mobile information devices such as mobile phones, portable music players, portable video players, electronic books, personal digital assistants (PDAs) and in image devices such as still cameras and video cameras. Further, the display device 524 can be used as a display part for displaying various information in transportation systems such as cars, aircraft, trains, and ships. Further, the display device 524 can be used as a display part for displaying various information in measuring devices, analysis devices, medical equipment, and advertising media.

Although the present invention has been described with reference to embodiments, the present invention is not limited to these embodiments. Various variations and modifications may be made without departing from the scope of the invention as set forth in the accompanying claims.

The present application is based on Japanese priority application No. 2017-053733, filed on Mar. 17, 2017, and Japanese priority application No. 2018-045946, filed on Mar. 13, 2018, with the Japanese Patent Office, the entire content of which is hereby incorporated by reference.

REFERENCE SIGNS LIST 10, 10A, 10B, 10C field-effect transistor
11 base
12 semiconductor film
13 gate insulating film
14, 14A, 14B, 14C gate electrode
15 source electrode
16 drain electrode
17 gate electrode covering layer
141, 142, 143 conductive film

The invention claimed is:

1. A field-effect transistor comprising:
a semiconductor film formed on a base;
a gate insulating film formed on a part of the semiconductor film;
a gate electrode formed on the gate insulating film;
a conductive film formed on the gate electrode; and
a source electrode and a drain electrode are formed on the base, in contact with the semiconductor film, wherein
the semiconductor film is formed of an n-type oxide semiconductor that includes at least one element selected from the group consisting of In, Zn, Sn, and Ti, and further including an alkaline earth element or a rare earth element,
a thickness of the source electrode and the drain electrode is smaller than a total thickness of the gate insulating film and the gate electrode,
the source electrode and the drain electrode cover a portion of the semiconductor film and are spaced apart from each other by a predetermined distance, thereby forming a channel that separates the source electrode and the drain electrode,
the gate insulating film is interposed between the source electrode and the drain electrode, and extends in a first extending direction that is orthogonal to a second extending direction in which the source electrode and the drain electrode extend,
the conductive film is made of the same material as a material of the source electrode and the drain electrode, the conductive film having a thickness smaller than a thickness of the gate insulating film, and
a width of the source electrode and a width of the drain electrode are each less than a length of the gate insulating film extending in the first extending direction.

2. The field-effect transistor according to claim 1, wherein the field-effect transistor is a top-gate field-effect transistor.

3. The field-effect transistor according to claim 1, wherein the gate insulating film includes a region whose width is narrower than a width of the gate electrode.

4. The field-effect transistor according to claim 1, wherein the gate electrode includes a plurality of layers.

5. The field-effect transistor according to claim 4, wherein widths of the plurality of layers become narrower layer by layer toward the gate insulating film.

6. A display element comprising:
a driving circuit; and
a light control element configured to control light output in accordance with a driving signal from the driving circuit,
wherein the light control element is driven by the field-effect transistor according to claim 1.

7. The display element according to claim 6, wherein the light control element is an electroluminescent element, an electrochromic element, a liquid crystal element, an electrophoretic element, or an electrowetting element.

8. A display device comprising:
a display unit in which a plurality of display elements are arranged, each of the plurality of display elements being the display element according to claim 6, and
a display control unit configured to control the plurality of display elements individually.

9. A system comprising:
the display device according to claim 8; and
an image data generating device configured to supply image data to the display device.

10. The field-effect transistor according to claim 1, wherein the n-type oxide semiconductor is doped with at least one dopant selected from a divalent cation, a trivalent cation, a tetravalent cation, a pentavalent cation, a hexavalent cation, a heptavalent cation, and an octavalent cation.

11. A method for producing a field-effect transistor, comprising:
forming a semiconductor film on a base;
forming a gate insulating film on a part of the semiconductor film;
forming a gate electrode on the gate insulating film;
forming a conductive film formed on the gate electrode;
patterning the gate electrode and the gate insulating film by etching using a same mask; and
forming a source electrode and a drain electrode on the base, in contact with the semiconductor film, wherein,
the semiconductor film is formed of an n-type oxide semiconductor that includes at least one element selected from the group consisting of In, Zn, Sn, and Ti, and further including an alkaline earth element or a rare earth element,
in the forming of the source electrode and the drain electrode, the source electrode and the drain electrode are formed such that a thickness of the source electrode and the drain electrode is smaller than a total thickness of the gate insulating film and the gate electrode,
the source electrode and the drain electrode cover a portion of the semiconductor film and are spaced apart from each other by a predetermined distance, thereby forming a channel that separates the source electrode and the drain electrode,
the gate insulating film is interposed between the source electrode and the drain electrode, and extends in a first extending direction that is orthogonal to a second extending direction in which the source electrode and the drain electrode extend,
the conductive film is made of the same material as a material of the source electrode and the drain electrode, the conductive film having a thickness smaller than a thickness of the gate insulating film, and a width of the source electrode and a width of the drain electrode are each less than a length of the gate insulating film extending in the first extending direction.

12. The method for producing a field-effect transistor according to claim 11, wherein
the gate electrode includes a plurality of conductive films,
in the forming of the source electrode and the drain electrode, the plurality of conductive films are laminated on the gate insulating film, and
in the patterning, etching is performed such that widths of the plurality of conductive films become narrower layer by layer toward the gate insulating film.

* * * * *